(12) United States Patent
Kim et al.

(10) Patent No.: US 8,183,113 B2
(45) Date of Patent: May 22, 2012

(54) METHODS OF FORMING RECESSED GATE STRUCTURES INCLUDING BLOCKING MEMBERS, AND METHODS OF FORMING SEMICONDUCTOR DEVICES HAVING THE RECESSED GATE STRUCTURES

(75) Inventors: Yong-Sung Kim, Seoul (KR); Tae-Young Chung, Gyeonggi-do (KR); Soo-Ho Shin, Gyeonggi-do (KR); Eun-Cheol Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 76 days.

(21) Appl. No.: 12/784,977

(22) Filed: May 21, 2010

(65) Prior Publication Data
US 2010/0248437 A1    Sep. 30, 2010

Related U.S. Application Data

(60) Division of application No. 11/507,753, filed on Aug. 22, 2006, now abandoned, which is a continuation-in-part of application No. 11/285,558, filed on Nov. 22, 2005, now abandoned.

(30) Foreign Application Priority Data

Aug. 24, 2005   (KR) .................. 10-2005-0077910

(51) Int. Cl.
  *H01L 21/336*   (2006.01)
(52) U.S. Cl. .. 438/270; 438/272; 257/332; 257/E21.429

(58) Field of Classification Search .................. 438/270, 438/271, 272; 257/330, 332, E21.429
See application file for complete search history.

(56) References Cited

U.S. PATENT DOCUMENTS

| | | | |
|---|---|---|---|
| 5,723,891 A | 3/1998 | Malhi | |
| 6,215,149 B1 * | 4/2001 | Lee et al. | 257/328 |
| 6,534,823 B2 | 3/2003 | Hueting et al. | |
| 6,762,098 B2 | 7/2004 | Hshieh et al. | |
| 6,770,535 B2 | 8/2004 | Yamada et al. | |
| 2001/0023960 A1 * | 9/2001 | Soga et al. | 257/330 |
| 2002/0000608 A1 * | 1/2002 | Harada | 257/328 |
| 2006/0163677 A1 * | 7/2006 | Heo et al. | 257/410 |

FOREIGN PATENT DOCUMENTS

| | | |
|---|---|---|
| JP | 2000-349289 | 12/2000 |
| KR | 100236048 B1 | 9/1999 |
| KR | 304717 | 7/2001 |

* cited by examiner

*Primary Examiner* — Tuan N. Quach
(74) *Attorney, Agent, or Firm* — Myers Bigel Sibley & Sajovec, P.A.

(57) ABSTRACT

A recessed gate structure in a semiconductor device includes a gate electrode partially buried in a substrate, a blocking member formed in the buried portion of the gate electrode, and a gate insulation layer formed between the gate electrode and the substrate. The blocking member may effectively prevent a void or a seam in the buried portion of the gate electrode from contacting the gate insulation layer adjacent to a channel region in subsequent manufacturing processes. Thus, the semiconductor device may have a regular threshold voltage and a leakage current passing through the void or the seam may efficiently decrease.

10 Claims, 24 Drawing Sheets

METHODS OF FORMING RECESSED GATE STRUCTURES INCLUDING BLOCKING MEMBERS, AND METHODS OF FORMING SEMICONDUCTOR DEVICES HAVING THE RECESSED GATE STRUCTURES

CROSS-REFERENCE TO RELATED APPLICATIONS

This application is a divisional application of U.S. patent application Ser. No. 11/507,753 filed Aug. 22, 2006, now abandoned, which is a continuation-in-part of U.S. patent application Ser. No. 11/285,558 filed Nov. 22, 2005, now abandoned, which are incorporated herein by reference in their entireties. This application also claims priority under 35 USC §119 to Korean Patent Application No. 2005-77190 filed on Aug. 24, 2005, the contents of which are incorporated herein by reference in their entirety.

FIELD OF THE INVENTION

The present invention relates generally to gate structures and, more particularly, to recessed gate structures, methods of forming recessed gate structures, and semiconductor devices having recessed gate structures.

BACKGROUND OF THE INVENTION

As semiconductor devices have become highly integrated, patterns therein have been formed with greatly reduced widths and intervals therebetween. Accordingly, precise technologies for forming finer patterns in semiconductor devices are increasingly being demanded. A width of a gate in a semiconductor device having a high integration degree may decrease according to a decrease of a design rule in the semiconductor device. Hence, in order to ensure a minute width and an increased channel length, methods of manufacturing semiconductor devices including a recessed gate electrode have been developed.

A conventional recessed gate electrode is disclosed in Korean Patent No. 304,717, Japanese Laid-Open Patent Publication No. 2000-349289 and U.S. Pat. No. 6,762,098 issued to Hshieh et al. Particularly, Korean Patent No. 236048 describes a transistor including a recessed gate electrode having an enlarged lower portion.

FIGS. 1A to 1F are cross-sectional views illustrating a method of manufacturing a transistor having a recessed gate electrode in accordance with Korean Patent No. 236048.

Referring to FIG. 1A, a first photosensitive film is formed on a substrate 1 having an active region and a field region defined by an isolation layer 3, and then the first photosensitive film is exposed and developed to form a first photosensitive film pattern 6 partially exposing the active region of the substrate 1.

Using the first photosensitive film pattern 6 as an ion implantation mask, impurities are doped into an exposed portion of the active region, thereby forming a first impurity region 9 and a channel region 12. The channel region 12 is formed on the first impurity region 9.

Referring to FIG. 1B, after removing the first photosensitive film pattern 6, a second photosensitive film pattern 14 is formed on the substrate 1 to expose the channel region 12.

The exposed channel region 12 is partially etched using the second photosensitive film pattern 14 as an etching mask so that a first trench 15 and a second trench 16 are formed on the channel region 12.

Referring to FIG. 1C, a first oxide layer is formed on the active region and on bottoms and sidewalls of the first and the second trenches 15 and 16 after removing the second photosensitive film pattern 14.

Portions of the first oxide layer on the active region and the bottoms of the first and the second trenches 15 and 16 are removed to thereby form first oxide layer patterns 18 on the sidewalls of the first and the second trenches 15 and 16.

Referring to FIG. 1D, a third photosensitive film pattern 21 is formed on the substrate 1 to expose the bottoms of the first and the second trenches 15 and 16 and also to expose the first oxide layer patterns 18.

Portions of the channel region 12 exposed by the first and the second trenches 15 and 16 are partially etched using the third photosensitive film pattern 21 and the first oxide layer patterns 18 as etching masks. Thus, lower portions of the first and the second trenches 15 and 16 are enlarged in rounded shapes. The first impurity region 9 is exposed by the first and the second trenches 15 and 16 having the enlarged lower portions.

Referring to FIG. 1E, the third photosensitive film pattern 21 and the first oxide layer patterns 18 are sequentially removed, and then second oxide layer patterns 24 are formed on sidewalls of the enlarged lower portions of the first and the second trenches 15 and 16.

A fourth photosensitive film pattern (not shown) is formed on the substrate 1 to cover the first trench 15. The fourth photosensitive film pattern exposes the bottom of the second trench 16. A portion of the second oxide layer patterns 24 on the bottom of the second trench 16 is removed using the fourth photosensitive film pattern as an etching mask. Hence, a portion of the first impurity region 9 is exposed through the second trench 16.

Referring to FIG. 1F, after removing the fourth photosensitive film pattern, a polysilicon layer is formed on the substrate 1 to fill up the first and the second trenches 15 and 16.

A portion of the polysilicon layer on the active region is removed by an etch-back process to thereby fort recessed gates 27 having enlarged lower portions buried in the first and the second trenches 15 and 16.

After a fifth photosensitive film pattern (not shown) is formed on the substrate 1 to expose the recessed gates 27, second impurity regions 30 are formed at upper portions of the recessed gates 27 by implanting impurities using the fifth photosensitive film pattern as a mask.

As for the above-mentioned method for manufacturing a transistor having the recessed gate, a void or a seam is generated in the enlarged lower portion of the recessed gate so that electrical characteristics of the transistor may deteriorate. This problem will be described in detail with reference to the accompanying drawings.

FIGS. 2A and 2B are electron microscopic pictures showing cross-sections of a conventional transistor having a recessed gate.

Referring to FIG. 2A, a polysilicon layer filling a trench having an enlarged lower portion is formed so as to form the recessed gate. An upper portion of the trench has a reduced width, for example, about 60 nm when a design rule of the transistor decreases. Thus, a void or a seam occurs in a lower portion of the polysilicon layer filling the trench, which has the enlarged lower portion. That is, the void or the seam is generated in a lower portion of the recessed gate.

As shown in FIG. 2B, the void or the seam generated in the lower portion of the recessed gate moves toward the gate insulation layer enclosing the recessed gate during subsequent processes for forming the transistor. Since a channel region of the transistor is formed around the lower portion of the recessed gate, the transistor may have poor electrical characteristics when the void or the seam makes contact with the channel region. In other words, when voids or seams are in contact with channel regions, threshold voltages of transistors in a unit cell of a semiconductor device may be considerably irregular and also leakage currents may be greatly increased through portions of the channel regions making contact with the voids or the seams. As a result, the transistor may have poor electrical characteristics when the void or the seam is in contact with the channel region thereof.

SUMMARY OF THE INVENTION

Some embodiments of the present invention provide a recessed gate structure having a blocking member for preventing the migration of a void or a seam to a gate insulating layer to allow improved electrical characteristics thereof.

Some embodiments of the present invention provide methods of forming a recessed gate structure having improved electrical characteristics by forming a blocking member therein.

Some embodiments of the present invention provide semiconductors including a recessed gate structure with a blocking member that can improve electrical characteristics thereof.

Some embodiments of the present invention provide methods of manufacturing semiconductor devices including recessed gate structures that can improve electrical characteristics thereof by forming a blocking member in the recessed gate structure.

According to some embodiments of the present invention, there is provided a recessed gate structure including a gate electrode partially buried in a substrate, a blocking member in a buried portion of the gate electrode, and a gate insulation layer formed between the substrate and the gate electrode.

According to some embodiments of the present invention, the gate electrode may include a first conductive layer pattern, a second conductive layer pattern and a third conductive layer pattern. The first conductive layer pattern may be buried in the substrate. The second conductive layer pattern may be formed on the first conductive layer pattern. The second conductive layer pattern may also be buried in the substrate. The third conductive layer pattern may be formed on the first conductive layer pattern, the second conductive layer pattern and the substrate.

According to some embodiments of the present invention, lower portions of the first and the second conductive patterns may be enlarged in circular shapes, elliptical shapes or track shapes, respectively.

According to some embodiments of the present invention, the first to the third conductive layer patterns may include doped polysilicon or metal.

According to some embodiments of the present invention, the blocking member may be formed between the first conductive layer pattern and the second conductive layer pattern.

According to some embodiments of the present invention, a void or a seam may be generated in the second conductive layer pattern. The blocking member may prevent the void or the seam from moving toward the gate insulation layer.

According to some embodiments of the present invention, the gate insulation layer may extend on the substrate. The blocking member may also extend on the extended gate insulation layer.

According to some embodiments of the present invention, the blocking member may include an oxide or a metal silicide.

For example, the blocking member may include silicon oxide, tungsten silicide, titanium silicide, cobalt silicide or tantalum silicide.

According to some embodiments of the present invention, the blocking member may be formed by an oxidization and silicidation of a surface of the first conductive layer pattern.

According to some embodiments of the present invention, the blocking member may be formed by a silicidation of a surface of the first conductive layer pattern.

According to some embodiments of the present invention, a thickness ratio among the gate insulation layer, the first conductive layer pattern and the second conductive layer pattern may be in a range of about 1.0:1.0 to 4.0:0.1 to 1.0.

According to some embodiments of the present invention, the gate electrode may include a first conductive layer and a second conductive layer pattern. The first conductive layer may be buried in the substrate. The second conductive layer pattern may be formed on the first conductive layer. The second conductive layer pattern may include a lower portion buried in the substrate and an upper portion protruded from the substrate.

According to some embodiments of the present invention, the first conductive layer and the second conductive layer pattern may include doped polysilicon or metal.

According to some embodiments of the present invention, lower portions of the first conductive layer and the second conductive layer pattern may be enlarged in circular shapes, elliptical shapes or track shapes, respectively.

According to some embodiments of the present invention, the blocking member may be formed between the first conductive layer and a lower portion of the second conductive layer pattern.

According to some embodiments of the present invention, a void or a seam may occur in the lower portion of the second conductive layer pattern. The blocking member may prevent the void or the seam from moving toward the gate insulation layer.

According to some embodiments of the present invention, there is provided a recessed gate structure including a substrate with a recess structure, which has an enlarged lower portion, a gate electrode partially buried in the recess structure, a gate mask formed on the gate electrode, a blocking member formed in the gate electrode, and a gate insulation layer formed between the recess structure and the gate electrode. The gate insulation layer extends on the substrate.

According to some embodiments of the present invention, the gate electrode may include a first conductive layer pattern, a second conductive layer pattern and a third conductive layer pattern. The first conductive layer pattern may be formed on the gate insulation layer to partially fill up the recess structure. The second conductive layer pattern may be formed on the first conductive layer pattern to fully fill up the recess structure. The third conductive layer pattern may be formed on the gate insulation layer, the first conductive layer pattern and the second conductive layer pattern.

According to some embodiments of the present invention, the gate electrode may include a first conductive layer and a second conductive layer pattern. The first conductive layer may be formed on the gate insulation layer to partially fill up the recess structure. The first conductive layer may extend on the extended gate insulation layer. The second conductive layer pattern may be formed on the first conductive layer to completely fill up the recess structure. The second conductive layer pattern may include a lower portion buried in the recess structure and an upper portion protruded from the substrate.

According to some embodiments of the present invention, there is provided a semiconductor device including a substrate with an isolation layer for defining an active region on the substrate, a recess structure, which is formed in the active region and has an enlarged lower portion, a gate electrode partially buried in the recess structure, a gate insulation layer extending between the recess structure and the gate electrode onto the active region, a blocking member formed in a buried portion of the gate electrode, and source/drain regions formed at portions of the substrate adjacent to the buried portion of the gate electrode.

According to some embodiments of the present invention, a void may occur in the buried portion of the gate electrode. Here, the blocking member may prevent the void from moving toward the gate insulation layer adjacent to the buried portion of the gate electrode.

According to some embodiments of the present invention, there is provided a method of forming a recessed gate structure. In the method of forming the recessed gate structure, a recess structure having an enlarged lower portion is formed in a substrate. A gate insulation layer is formed on surfaces of the recess structure and the substrate. A gate electrode partially buried in the recess structure is formed on the gate insulation layer. A blocking member is formed in a buried portion of the gate electrode.

In the formation of the recess structure according to some embodiments of the present invention, a first mask may be formed on the substrate. A first recess may be formed from the surface of the substrate by etching the substrate using the first mask. A second mask may be formed on a sidewall of the first recess. A second recess may be formed beneath the first recess by etching the substrate using the second mask.

In the formation of the gate electrode and the blocking member according to some embodiments of the present invention, a first conductive layer pattern may be formed on the gate insulation layer to partially fill up the recess structure. The blocking member may be formed on the first conductive layer pattern. A second conductive layer pattern may be formed on the blocking member to fully fill up the recess structure. A third conductive layer pattern may be formed on the first conductive layer pattern, the second conductive layer pattern and the blocking member.

In the formation of the first conductive layer pattern and the blocking member according to some embodiments of the present invention, a first conductive layer may be formed on the gate insulation layer. A preliminary blocking member may be formed on the first conductive layer. The first conductive layer pattern and the blocking member may be formed by partially removing the first conductive layer and the preliminary blocking member.

According to some embodiments of the present invention, the preliminary blocking member may be partially removed using an etching solution including fluoride or an etching gas including fluoride. The first conductive layer may be partially removed by an etch-back process.

In the formation of the gate electrode and the blocking member according to some embodiments of the present invention, a first conductive layer may be formed on the gate insulation layer to partially fill up the recess structure. The blocking member may be formed on the first conductive layer. A second conductive layer pattern may be farmed on the blocking member to fill up the recess structure and to be protruded from the substrate.

According to some embodiments of the present invention, there is provided a method of manufacturing a semiconductor device. In the method of manufacturing the semiconductor device, an isolation layer is formed on a substrate to define an active region. A recess structure having an enlarged lower portion is formed in the active region. A gate insulation layer is formed from a surface of the recess structure onto the active region. A gate electrode partially buried in the recess structure is formed on the gate insulation layer. A blocking member is formed in a buried portion of the gate electrode. Source/drain regions are formed at portions of the substrate adjacent to the gate electrode.

According to some embodiments of the present invention, the blocking member is formed in the enlarged lower portion of the recessed gate electrode and efficiently separates a void or a seam formed in the gate electrode from the gate insulation layer adjacent to the channel region and prevents the void or the seam from moving to the channel region. Therefore, the semiconductor device having the recessed gate structure may have a uniform threshold voltage and a leakage current through the void or the seam may be suppressed. Additionally, the channel region of the semiconductor device is formed along the recessed gate electrode and the recessed gate electrode has the enlarged lower portion in a circular shape, an elliptical shape or a track shape, thereby considerably increasing a channel length of the semiconductor device.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE EMBODIMENTS

Figure 1A:
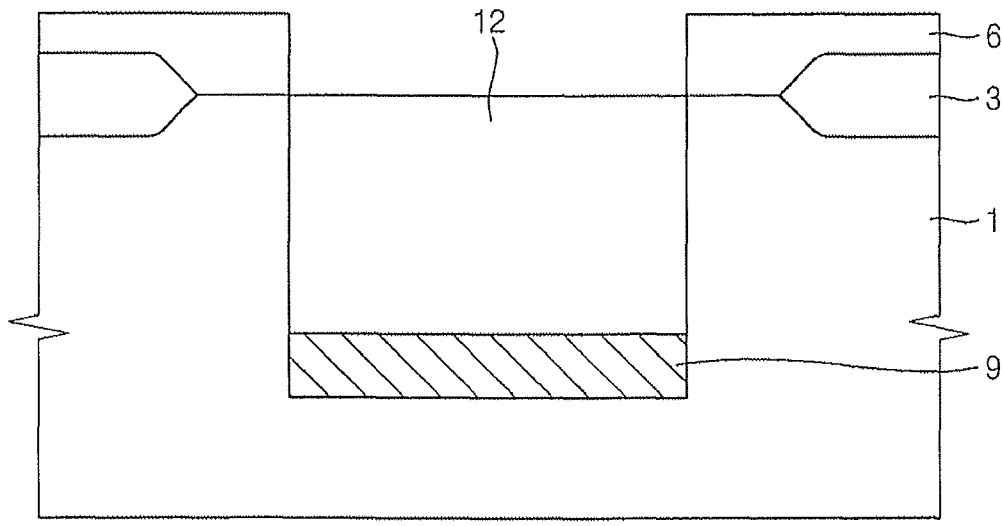
FIGS. 1A to 1F are cross-sectional views illustrating a method of forming a conventional transistor including a recessed gate.
Figure 1B:
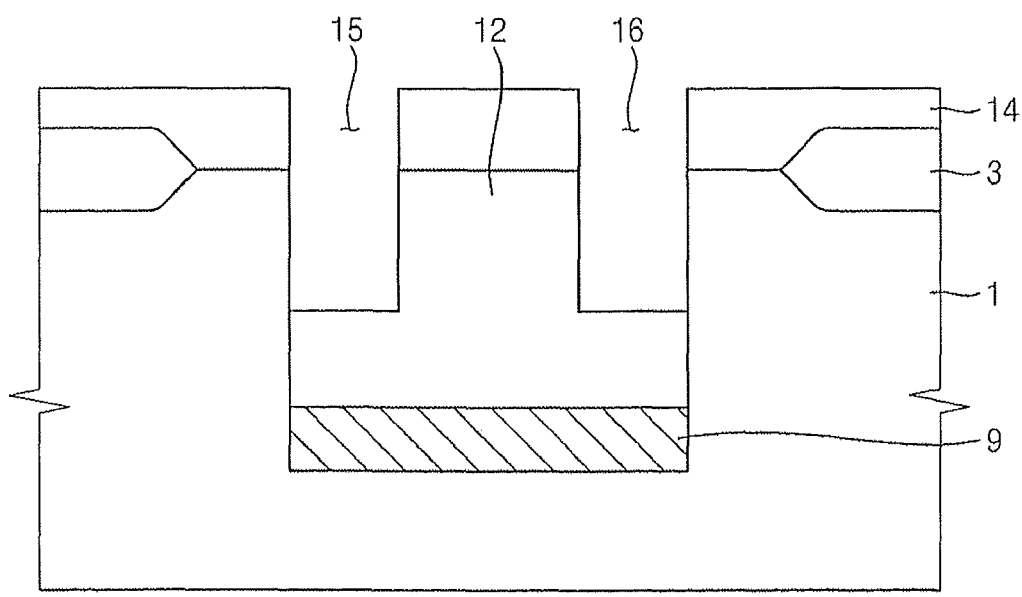
Figure 1C:
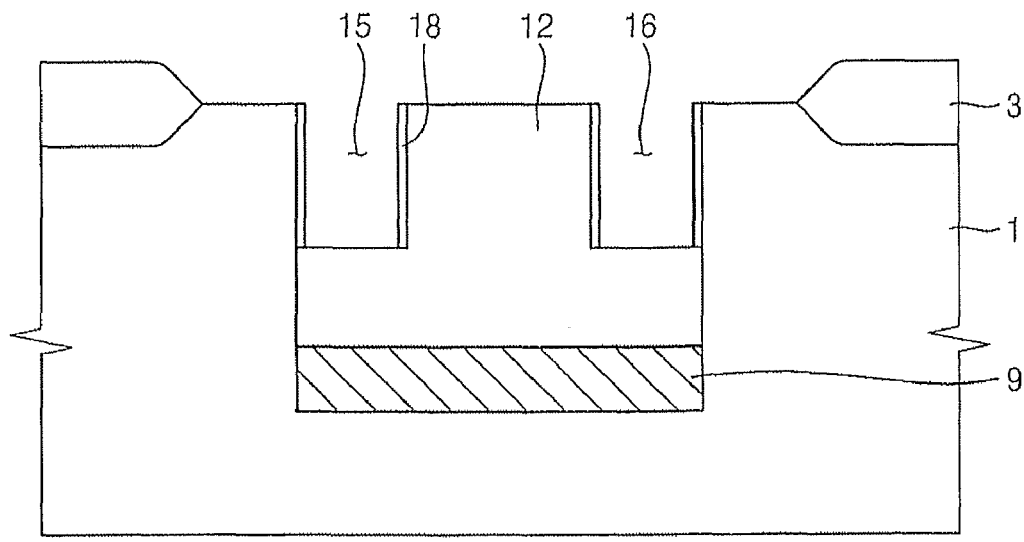
Figure 1D:
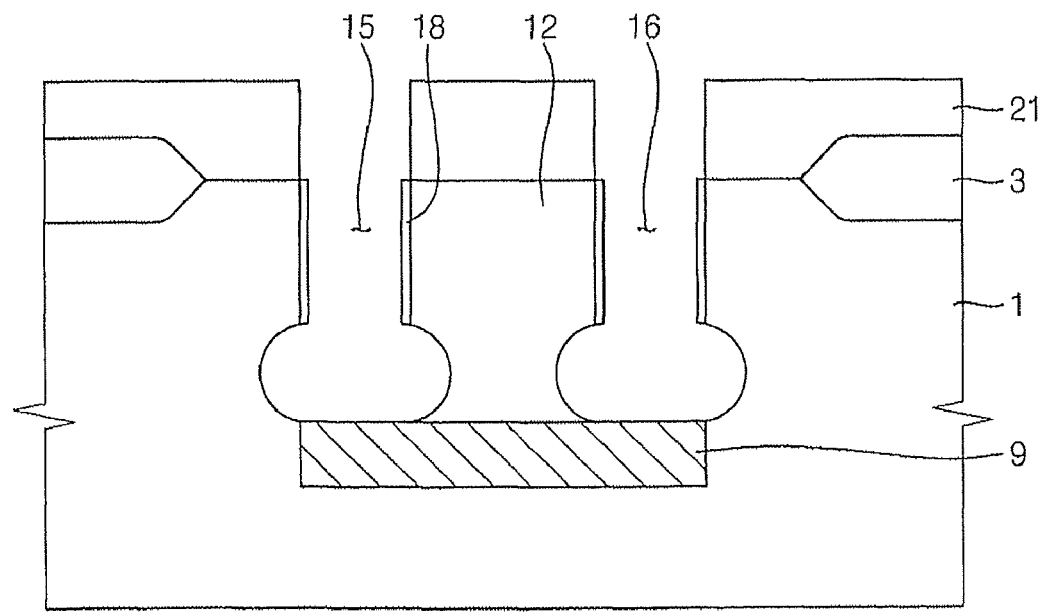
Figure 1E:
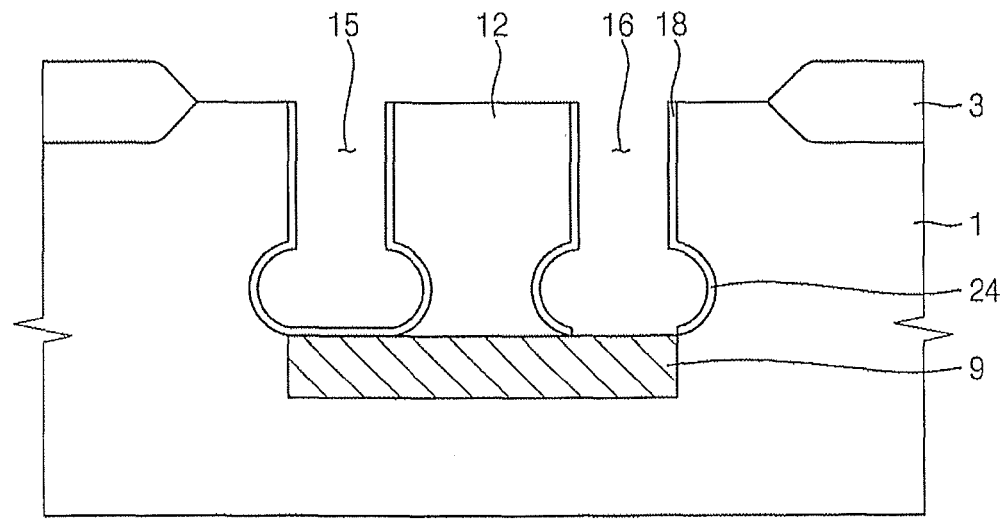
Figure 1F:
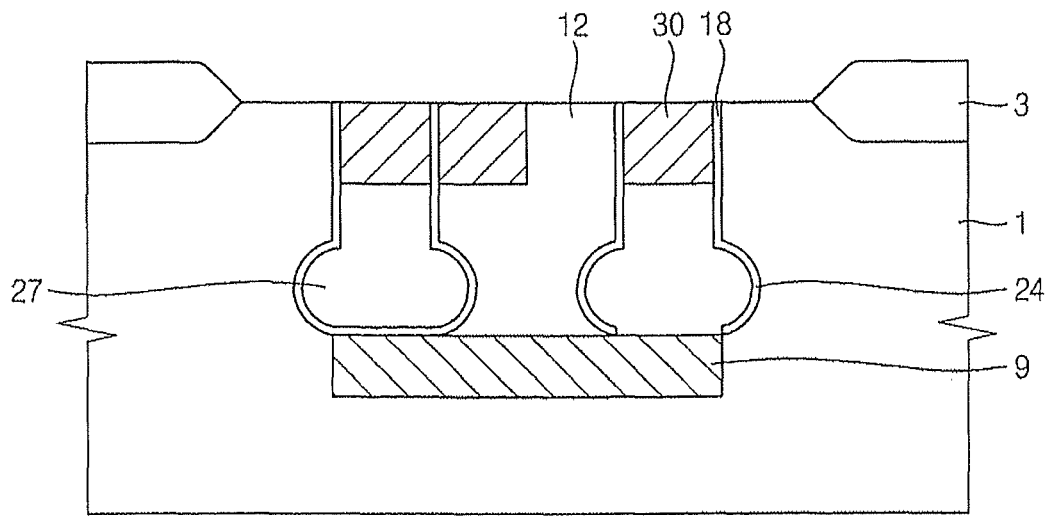
Figure 2A:
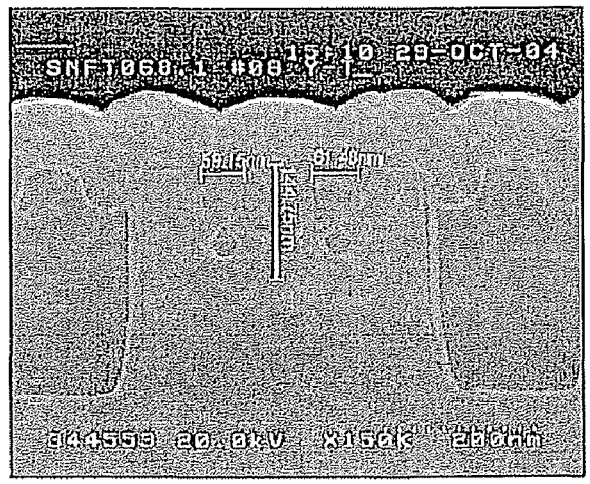
FIGS. 2A and 2B are electron microscopic pictures showing cross-sections of a conventional transistor including a recessed gate.
Figure 2B:
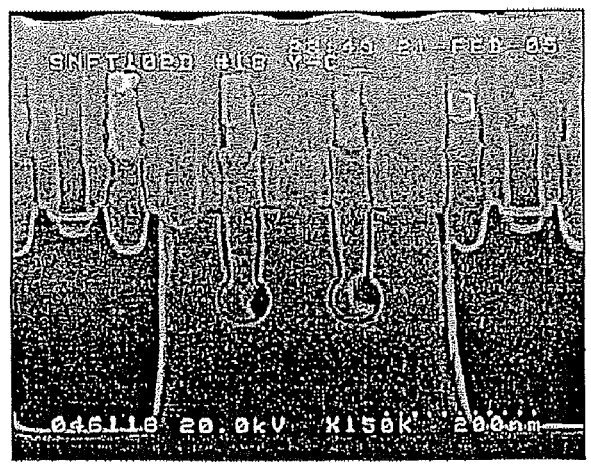

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of a device in use or operation in addition to the orientation depicted in the figures. For example, if a device in the figures is turned over, elements described as "below" or "beneath" other elements or features would then be oriented "above" the other elements or features. Thus, the exemplary term "below" can encompass both an orientation of above and below. A device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The term "track shape" is defined herein to mean any generally circular or oval shape and that may or may not include one or more generally linear sections.

Recessed Gate Structures and Methods of Manufacturing the Same

Figure 3:
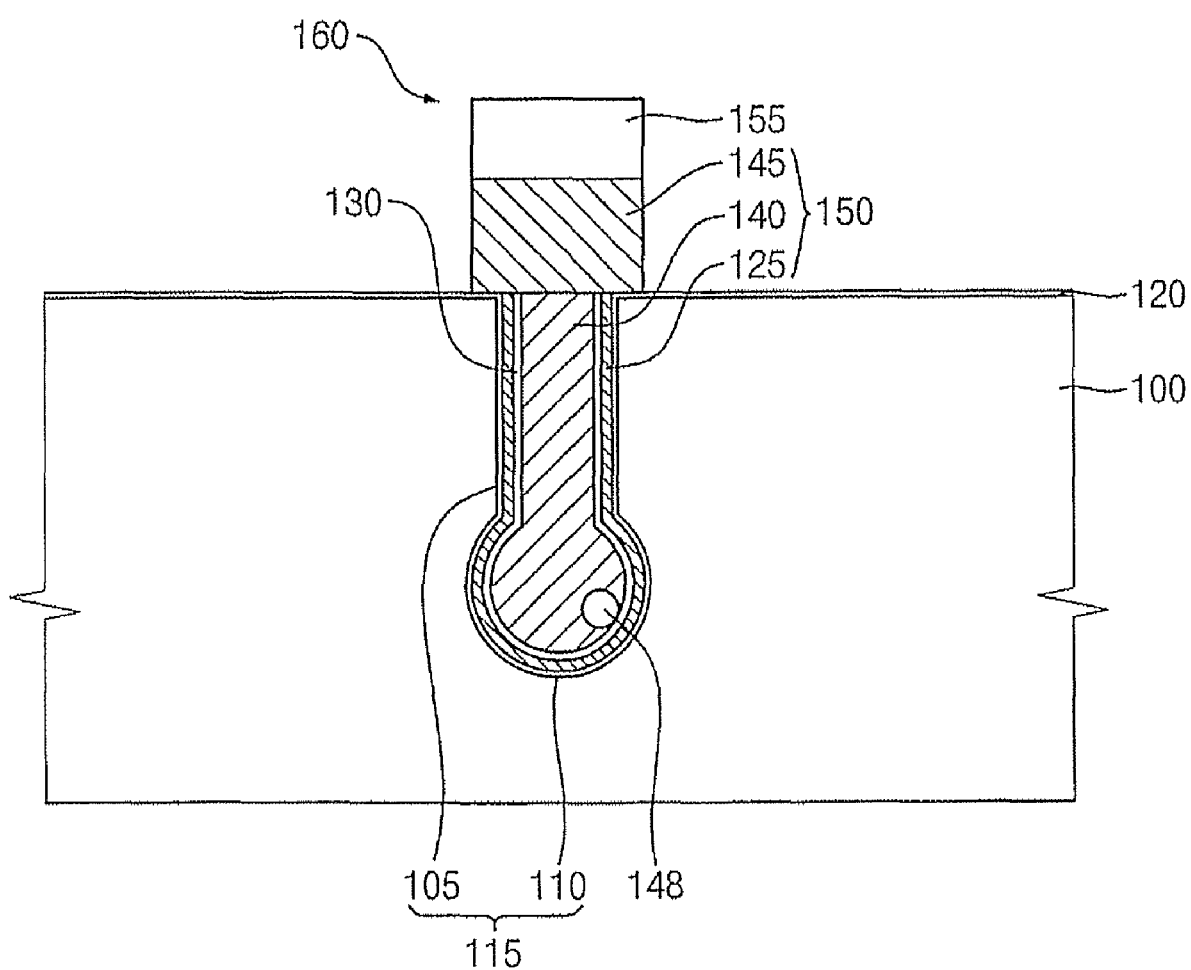
FIG. 3 is a cross-sectional view illustrating a recessed gate structure in accordance with some embodiments of the present invention.

FIG. 3 is a cross-sectional view illustrating a recessed gate structure in accordance with some embodiments of the present invention.

Referring to FIG. 3, a recessed gate structure 160 formed on a substrate 100 includes a gate insulation layer 120, a blocking member 130, a gate electrode 150 and a gate mask 155.

The substrate 100 may include a semiconductor substrate such as a silicon wafer or a silicon-on-insulator (SOI) substrate. A recess structure 115 having a first recess 105 and a second recess 110 is formed in an upper portion of the substrate 100. The first recess 105 may be formed from a surface of the substrate 100 along a first direction substantially perpendicular to the substrate 100. The second recess 110 is formed beneath the first recess 105. The second recess 110 communicates with the first recess 105. The second recess 110 may be enlarged along the first direction and a second direction substantially perpendicular to the first direction. Thus, the second recess 110 may have a width substantially wider that that of the first recess 105. For example, the second recess 110 may have a cross section of a circular shape, an elliptical shape or a track shape.

The gate insulation layer 120 is formed on surfaces of the first recess 105, the second recess 110 and the substrate 100. The gate insulation layer 120 may extend from the recess structure 115 to the substrate 100. The gate insulation layer 120 may include an oxide or a metal oxide having a high dielectric constant. For example, the gate insulation layer 120 may include silicon oxide ($SiO_x$), hafnium oxide ($HfO_x$), tantalum oxide ($TaO_x$), zirconium oxide ($ZrO_x$), titanium oxide ($TiO_x$), aluminum oxide ($AlO_x$), etc. The gate insulation layer 120 may have a first thickness measured from the surfaces of the first and the second recesses 105 and 110. For example, the gate insulation layer 120 may have a first thickness of about 50 Å to about 100 Å.

The gate electrode 150 includes a first conductive layer pattern 125, a second conductive layer pattern 140 and a third conductive layer pattern 145.

The first conductive layer pattern 125 is formed on the gate insulation layer 120 positioned on the surfaces of the first and the second recesses 105 and 110. The first conductive layer pattern 125 on the gate insulation layer 120 partially fills up the recess structure 115. A lower portion of the first conductive layer pattern 125 is positioned on the second recess 110 and an upper portion of the first conductive layer pattern 125 is formed on the first recess 105. Thus, the lower portion of the first conductive layer pattern 125 is also enlarged along the first direction and the second direction with respect to the substrate 100. For example, the lower portion of the first conductive layer pattern 125 may have a cross section of a circular shape, an elliptical shape or a track shape.

The first conductive layer pattern 125 may be formed using a first conductive material. Examples of the first conductive material may include polysilicon doped with impurities, tungsten (W), aluminum (Al), titanium (Ti), tantalum (Ta), copper (Cu), etc. The first conductive layer pattern 125 may have a second thickness of about 100 Å to about 200 Å based on an upper face of the gate insulation layer 120. Therefore, a thickness ratio between the gate insulation layer 120 and the first conductive layer pattern 125 may be in a range of about 1.0:1.0 to 4.0.

The blocking member 130 is formed on the first conductive layer pattern 125 in the recess structure 115. The blocking member 130 is located between the first conductive layer pattern 125 and the second conductive layer pattern 140. According to some embodiments of the present invention, the blocking member 130 may be formed by an oxidization and silicidation of a surface of the first conductive layer pattern 125. According to some embodiments of the present invention, the blocking member 130 may be formed by depositing oxide on the first conductive layer pattern 125.

The blocking member 130 may have a third thickness substantially thinner than the first thickness of the gate insulation layer 120. The blocking member 130 may have the third thickness of about 10 Å to about 50 Å measured from an upper face of the first conductive layer pattern 125. Hence, a thickness ratio of the gate insulation layer 120 relative to the blocking member 130 may be in a range of about 1.0:0.1 to 1.0. Additionally, a thickness ratio between the first conductive layer pattern 125 and the blocking member 130 may be in a range of about, 1.0:0.05 to 0.5. As a result, a thickness ratio among the gate insulation layer 120, the first conductive layer pattern 125 and the blocking member 130 may be in a range of about 1.0:1.0 to 4.0:0.1 to 1.0.

The second conductive layer pattern 140 of the gate electrode 150 is formed on the blocking member 130 to completely fill up the recess structure 115. The second conductive layer pattern 140 may be formed using a second conductive material. Examples of the second conductive material may include doped polysilicon, tungsten, aluminum, titanium, tantalum, copper, etc. The first conductive layer pattern 125 partially fills up the first and the second recesses 105 and 110, whereas the second conductive layer pattern 140 fully fills up the first and the second recesses 105 and 110. Particularly, an upper portion of the second conductive layer pattern 140 sufficiently fills up the first recess 105, and a lower portion of the second conductive layer pattern 140 completely fills up the second recess 110. Hence, the lower portion of the second conductive layer pattern 140 is enlarged in the first and the second directions relative to the substrate 100. For example, the lower portion of the second conductive layer pattern 140 may have a cross section of a circular shape, an elliptical shape or a track shape.

In the formation of the second conductive layer pattern 140, a void 148 or a seam is generated in the lower portion of the second conductive layer pattern 140. Particularly, the void 148 or the seam occurs in the lower portion of the second conductive layer pattern 140 filling up the second recess 110. The blocking member 130 enclosing the second conductive layer pattern 140 effectively prevents the migration of the void 148 or the seam toward the gate insulation layer 120 adjacent to a channel region of a semiconductor device such as a transistor. Therefore, the semiconductor device may have improved electrical characteristics such as a uniform threshold voltage, a reduced leakage current, etc.

The third conductive layer pattern 145 of the gate electrode 150 is formed on the first conductive layer pattern 125, the blocking member 130, the second conductive layer pattern 140 and the gate insulation layer 120. The third conductive layer pattern 145 may be formed using a third conductive material. For example, the third conductive layer pattern 145 may be formed using doped polysilicon, tungsten, aluminum, titanium, tantalum, copper, etc.

According to some embodiments of the present invention, the third conductive layer pattern 145 may have a polycide structure that includes a doped polysilicon film pattern and a metal silicide film pattern.

The gate mask 155 is formed on the third conductive layer pattern 145 of the gate electrode 150. The gate mask 155 may be formed using a material having an etching selectivity relative to the gate electrode 150. That is, the gate mask 155 may be formed using, for example, a nitride, an oxynitride or an oxide. For example, the gate mask 155 may be formed using silicon nitride, silicon oxynitride, titanium oxynitride, silicon oxide, etc.

As described above, the migration of the void 148 or the seam is efficiently blocked by the blocking member 130 formed in the gate electrode 150 so that the recessed gate structure 160 may have a uniform threshold voltage and a reduced leakage current by preventing the void 148 or the seam from contacting the gate insulation layer 120 adjacent to the channel region.

FIGS. 4A to 4H are cross-sectional views illustrating a method of forming a recessed gate structure in accordance with some embodiments of the present invention.

Figure 4A:
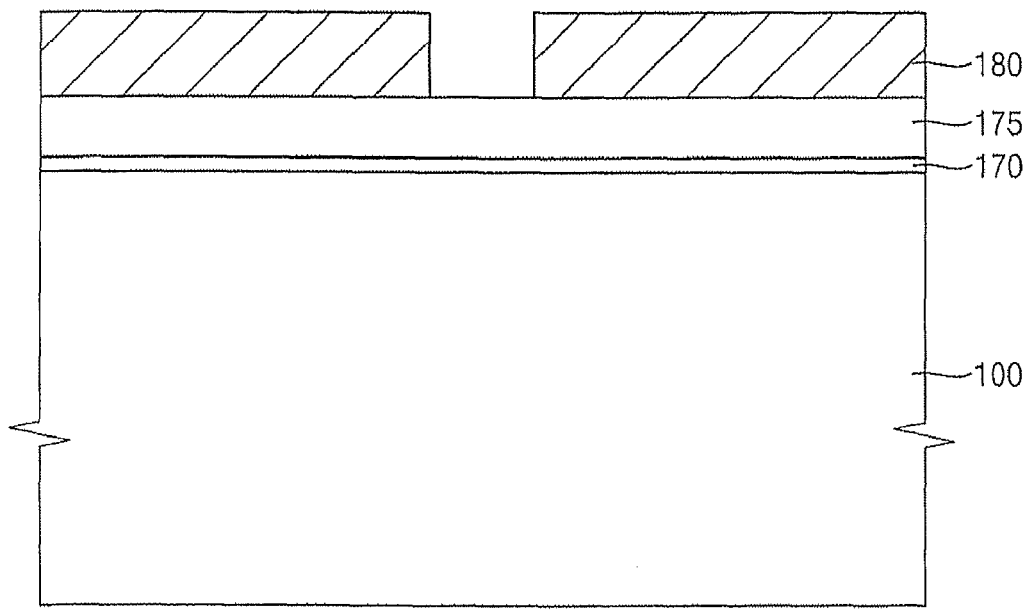
FIGS. 4A to 4H are cross-sectional views illustrating a method of forming a recessed gate structure in accordance with some embodiments of the present invention.

Referring to FIG. 4A, a buffer oxide layer 170 and a first mask layer 175 are successively formed on a substrate 100 corresponding to a silicon wafer or an SOI substrate.

The buffer oxide layer 170 may be formed on the substrate 100 by, for example, a thermal oxidation process, a chemical vapor deposition (CVD) process, a plasma enhanced chemical vapor deposition (PECVD) process, a high density plasma-chemical vapor deposition (HDP-CVD) process, etc.

The first mask layer 175 may be formed on the buffer oxide layer 170 using a material having an etching selectivity with respect to the buffer oxide layer 170 and the substrate 100. For example, the first mask layer 175 may be formed using a nitride such as silicon nitride or an oxynitride such as silicon oxynitride, titanium oxynitride, etc. The first mask layer 175 may be formed by, for example, a CVD process, a PECVD process, an atomic layer deposition (ALD) process, a sputtering process, an electron beam evaporation process, a pulsed laser deposition (PLD) process, etc.

After a first photoresist film is formed on the first mask layer 175, the first photoresist film is exposed and developed to form a first photoresist pattern 180 that partially exposes the first mask layer 175.

Figure 4B:
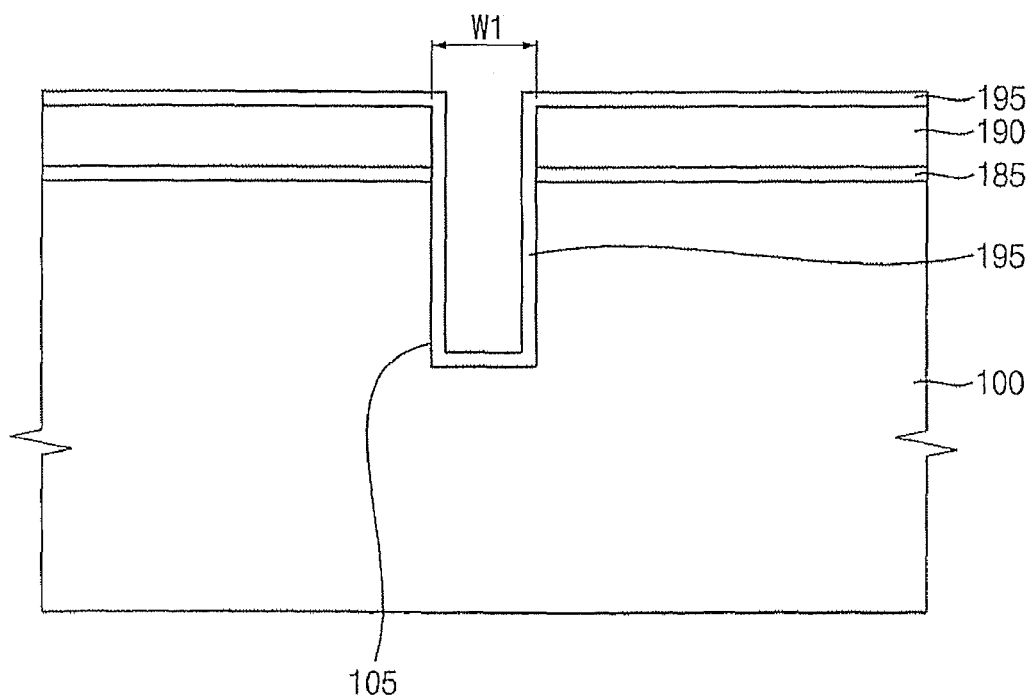

Referring to FIG. 4B, the first mask layer 175 is partially etched using the first photoresist pattern 180 as an etching mask, thereby forming a first mask 190 on the buffer oxide layer pattern 185. The first photoresist pattern 180 may be removed from the first mask 190 by, for example, an ashing process and/or a stripping process.

The buffer oxide layer 170 and the substrate 100 are partially etched by a first etching process using the first mask 190 as an etching mask. Thus, a first recess 105 is formed at an upper portion of the substrate 100 and a buffer oxide layer pattern 185 is formed on the substrate 100. The first mask 190 serves as the etching mask for forming the first recess 105. The first etching process may include an anisotropic etching process. The first recess 105 may have a first width W1. For example, the first recess 105 may have a first width W1 of about 500 Å to about 700 Å. The first recess 105 may be formed along a first direction substantially perpendicular to the substrate 100. Namely, the first recess 105 is formed along a vertical direction from a surface of the substrate 100.

A second mask layer 195 is continuously formed on a bottom and a sidewall of the first recess 105 and on the first mask 190. In particular, the second mask layer 195 is formed on the sidewall of the first recess 105, on vertical cross sections of the substrate 100, the buffer oxide layer pattern 185 and the first mask 190, which are exposed by the first recess 105, and on an upper face of the first mask 190. The second mask layer 195 may be formed using a material that has an etching selectivity with respect to the substrate 100. For example, the second mask layer 195 may be formed using an oxide such as silicon oxide, a nitride such as silicon nitride or an oxynitide such as silicon oxynitride or titanium oxynitride. The second mask layer 195 may be formed, for example, by a CVD process, an ALD process, a PECVD process, an HDP-CVD process, a sputtering process, an electron beam evaporation process, a PLD process, etc. According to some embodiments of the present invention, the second mask layer 195 may be formed using a material substantially the same as that of the first mask layer 175. According to some embodiments of the present invention, the second mask layer 195 may be formed using a material different from that of the first mask layer 175.

Figure 4C:
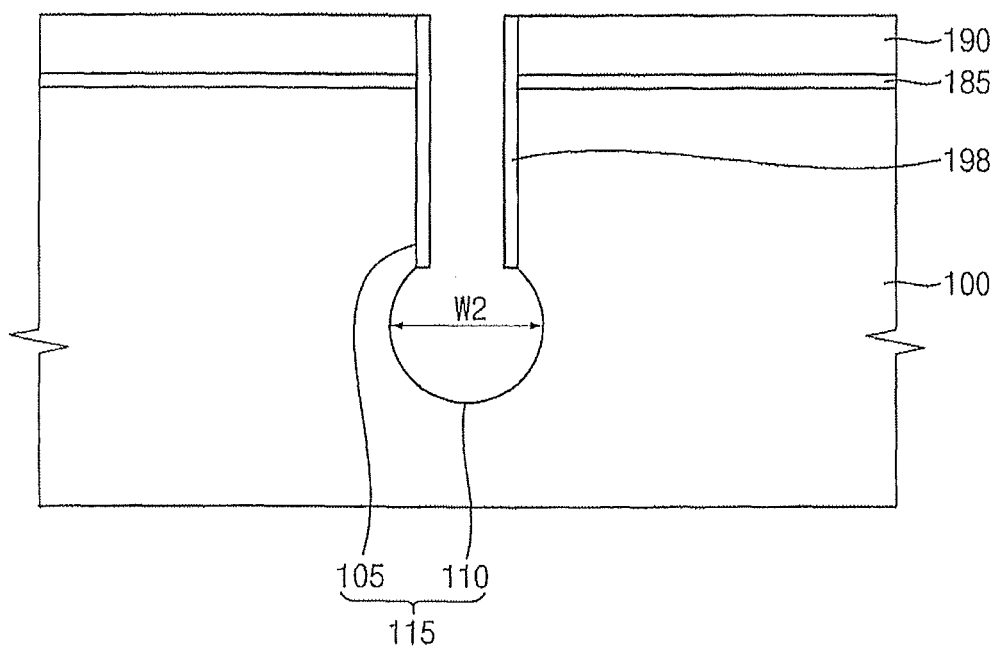

Referring to FIG. 4C, a second mask 198 is formed on the sidewall of the first recess 105 by removing portions of the second mask 198 on the first mask 190 and the bottom of the first recess 105. The second mask 198 may be formed, for example, by an etch-back process. Since the second mask 198 is formed on the sidewall of the first recess 105, the portion of the substrate 100 is exposed by the first recess 105 after the formation of the second mask 198.

The exposed portion of the substrate 100 is etched by a second etching process using the second mask 198 as an etching mask so that a second recess 110 is formed beneath the first recess 105. The second recess 110 communicates with the first recess 105. The second mask 198 serves as the etching mask for forming the second recess 110. Therefore, a recess structure 115 including the first and the second recesses 105 and 110 is formed at the upper portion of the substrate 100. The second etching process may include an isotropic etching process. As a result of the second mask 198, the second recess 110 is formed and extended along the first direction and a second direction substantially perpendicular to the first direction. That is, the second recess 110 is formed in a vertical direction and a horizontal direction relative to the substrate 100. Hence, the second recess 110 has a second width W2 substantially wider than the first width W1 of the first recess 105 (see FIG. 4C). For example, the second recess 110 may have a cross section having a circular shape, an elliptical shape, a track shape, etc.

Figure 4D:
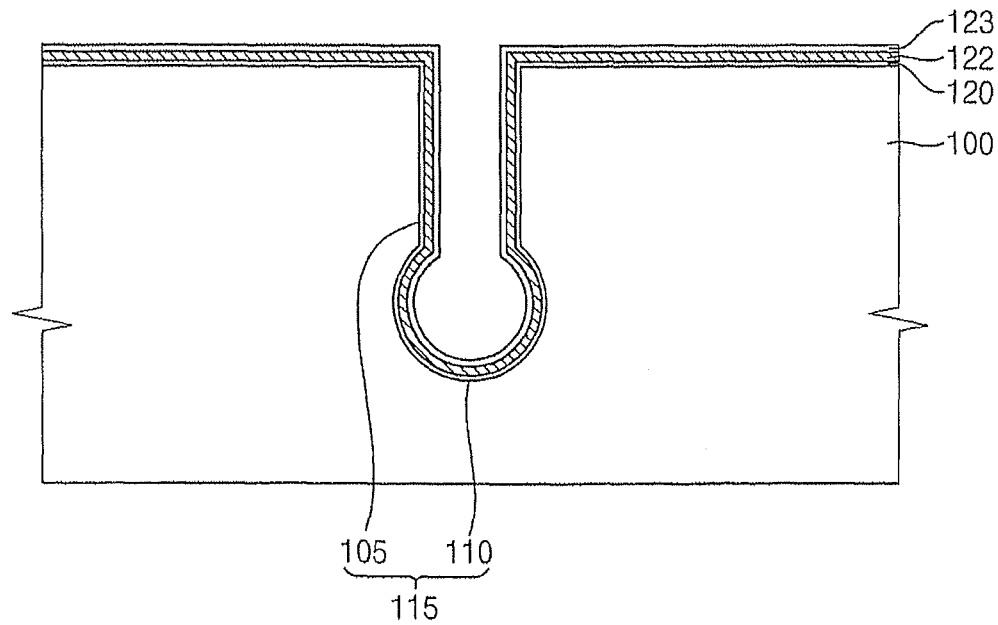

Referring to FIG. 4D, the first mask 190, the second mask 198 and the buffer oxide layer pattern 185 are sequentially removed to complete the recess structure 115 at the upper portion of the substrate 100. The first mask 190, the second mask 198 and the buffer oxide layer pattern 185 may be simultaneously removed from the substrate 100.

A gate insulation layer 120 is formed on a surface of the recess structure 115 and the substrate 100. The gate insulation layer 120 extends on the substrate 100 from the second recess 110 and the first recess 105. The gate insulation layer 120 may be formed, for example, by a thermal oxidation process, a CVD process, a PECVD process, an ALD process, an HDP-CVD process, etc. Further, the gate insulation layer may be formed using an oxide or a metal oxide having a high dielectric constant. For example, the gate insulation layer 120 may be formed using silicon oxide, hafnium oxide, tantalum oxide, zirconium oxide, titanium oxide, aluminum oxide, etc. The gate insulation layer 120 may have a first thickness measured from the upper faces of the first and the second recesses 105 and 110. For example, the gate insulation layer 120 may have a first thickness of about 50 Å to about 100 Å. When the first width W1 of the first recess 105 is about 600 Å, the first thickness of the gate insulation layer 120 may be about 50 Å.

A first conductive layer 122 is formed on the gate insulation layer 120 with which the recess structure 115 is coated. The first conductive layer 122 may be formed using a first conductive material such as doped polysilicon or metal. The first conductive layer 122 may be formed, for example, by a CVD process, a PECVD process, an ALD process, a sputtering process, a PLD process, an electron beam evaporation process, etc. The first conductive layer 122 may have a second thickness based on an upper face of the gate insulation layer 120. For example, the first conductive layer 122 may have a second thickness of about 100 Å to about 200 Å. When the first recess 105 has a first width W1 of about 600 Å, the first conductive layer 122 may have a second thickness of about 100 Å. Since the gate insulation layer 120 has a first thickness of about 50 Å, the first recess 105 has a reduced width of about 300 Å in accordance with the formations of the gate insulation layer 120 and the first conductive layer 122. That is, the first conductive layer 122 may have a second thickness corresponding to one-third of the first width W1 so that the first recess 105 may have a reduced width corresponding to a half of the first width W1.

According to some embodiments of the present invention, a preliminary blocking member 123 may be formed on the first conductive layer 122, for example, by an oxidization and silicidation of a surface of the first conductive layer 122. For example, the preliminary blocking member 123 may be formed by a thermal oxidation process. In the thermal oxidation process, oxygen may react with silicon contained in the first conductive layer 122 so that the preliminary blocking member 123 may be formed on the first conductive layer 122.

According to some embodiments of the present invention, the preliminary blocking member 123 may be formed by depositing an oxide on the first conductive layer 122 through, for example, a CVD process, a PECVD process, an ALD process or an HDP-CVD process.

The preliminary blocking member 123 may have a third thickness measured from an upper face of the first conductive layer 122. For example, the preliminary blocking member 123 may have a third thickness of about 10 Å to about 50 Å. When the first width W1 of the first recess 105 is about 600 Å, the third thickness of the preliminary blocking member 123 may be about 10 Å. Since the preliminary blocking member 123 has a relatively thin third thickness, the reduced width of the first recess 105 may be slightly decreased after the formation of the preliminary blocking member 123.

Figure 4E:
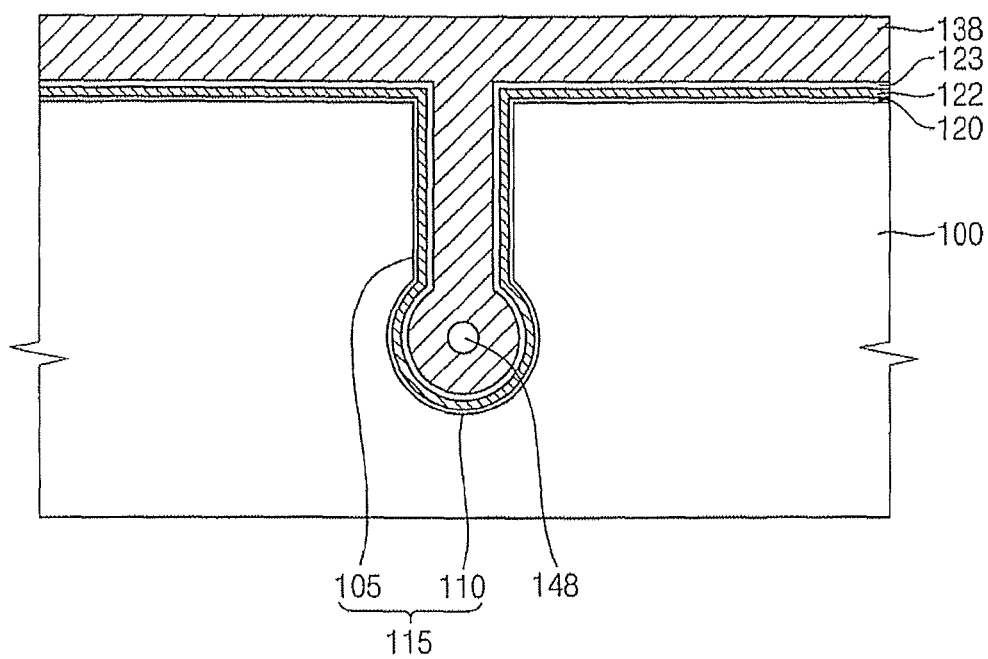

Referring to FIG. 4E, a second conductive layer 138 is formed on the preliminary blocking member 123 to completely fill up the recess structure 115 having the first and the second recesses 105 and 110. The second conductive layer 138 may be formed, for example, using a second conductive material such as doped polysilicon or metal. Further, the second conductive layer 138 may be formed, for example, by a CVD process, a PECVD process, an ALD process, a sputtering process, a PLD process, an electron beam evaporation process, etc.

In the formation of the second conductive layer 138 filling up the recess structure 115 having an enlarged lower portion (the second recess 110), the second conductive layer 138 may not completely fill up the second recess 110 because the second recess 110 has an enlarged structure compared to the first recess 105. Thus, a void 148 or a seam may be generated in a lower portion of the second conductive layer 138 filling the second recess 110.

Figure 4F:
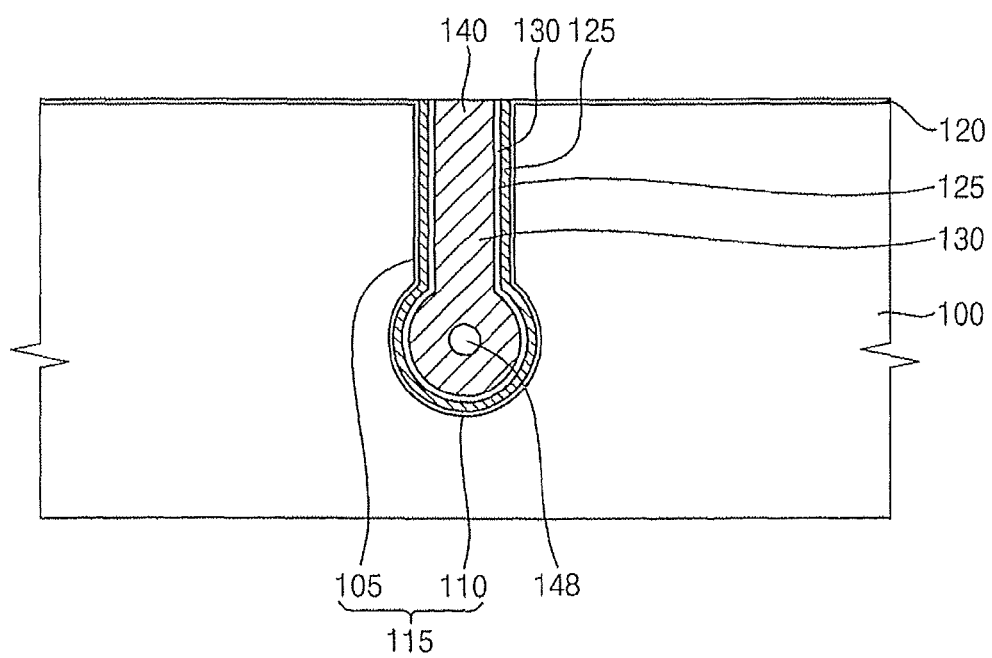

Referring to FIG. 4F, the second conductive layer 138 is partially removed to form a second conductive layer pattern 140 buried in the recess structure 115. Particularly, a portion of the second conductive layer 138 over the substrate 100 is removed until the preliminary blocking member 123 is exposed to thereby form the second conductive layer pattern 140 sufficiently filling up the recess structure 115. The second conductive layer pattern 140 may be formed by an etch-back process. When the second conductive layer pattern 140 is formed in the recess structure 115, the preliminary blocking member 123 is exposed.

The exposed preliminary blocking member 123 and the first conductive layer 122 are partially removed until the gate insulation layer 120 is exposed to form a blocking member 130 and a first conductive layer pattern 125. The blocking member 130 encloses the second conductive layer pattern 140 and the first conductive layer pattern 125 locates between the gate insulation layer 120 and the blocking member 130. Namely, the first conductive layer pattern 125 and the blocking member 130 are sequentially formed between the gate insulation layer 120 and the second conductive layer pattern 140 in the recess structure 115. The blocking member 130 may be formed, for example, by a wet etching process using an etching solution containing fluorine (F). Alternatively, the blocking member 130 may be formed, for example, by a dry etching process using an etching gas containing fluorine. Additionally, the first conductive layer pattern 125 may be formed, for example, by an etch-back process. When the first conductive layer pattern 125, the blocking member 130 and the second conductive layer pattern 140 are formed in the recess structure 115, a portion of the gate insulation layer 120 on the substrate 100 is exposed.

Figure 4G:
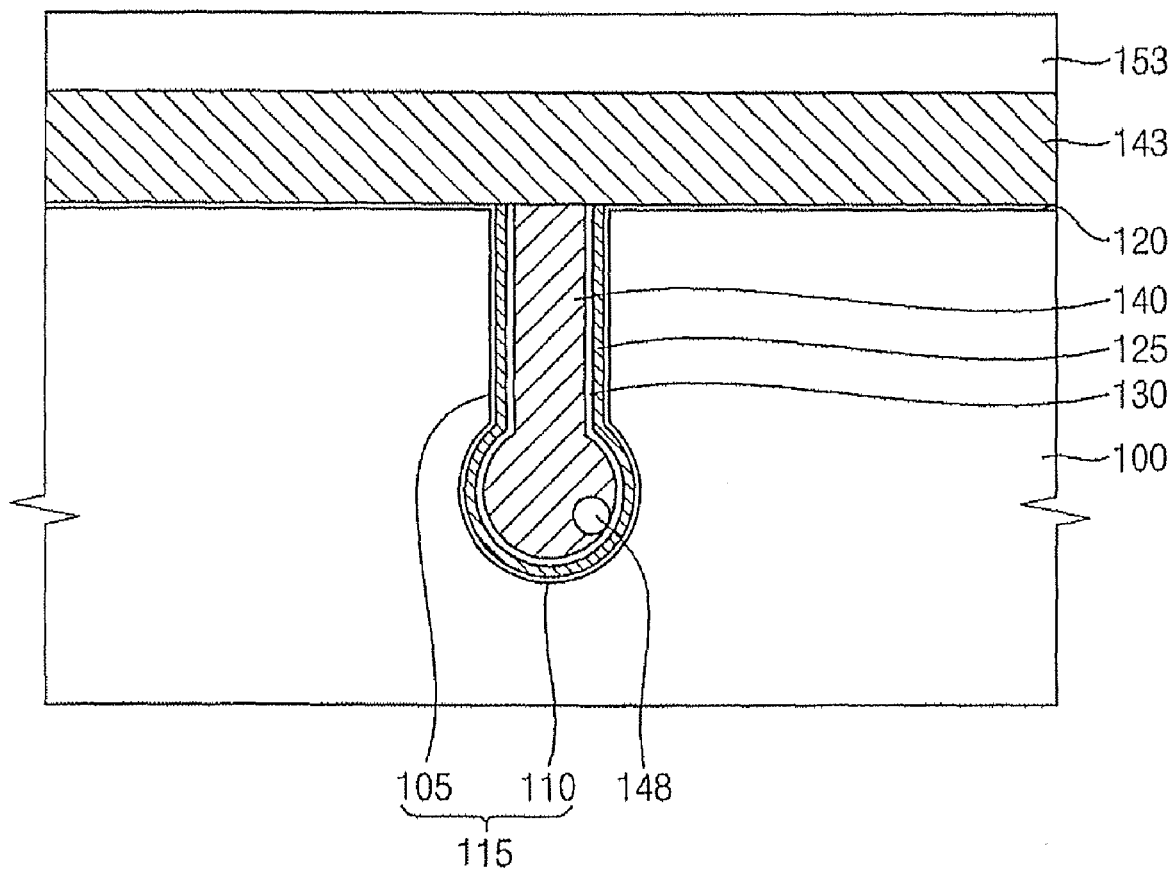

Referring to FIG. 4G, a third conductive layer 143 is formed on the exposed portion of the gate insulation layer 120, the first conductive layer pattern 125, the blocking member 130 and the second conductive layer pattern 140. The third conductive layer 143 may be formed using a third conductive materials such as doped polysilicon, tungsten, titanium, aluminum, tantalum, copper, etc. The third conductive layer 143 may be formed, for example, by a CVD process, a PECVD process, an ALD process, a sputtering process, an electron beam evaporation process, a PLD process, etc. According to some embodiments of the present invention, the third conductive layer 143 may have a polycide structure that includes a doped polysilicon film and a metal silicide film.

A gate mask layer 153 is formed on the third conductive layer 143. The gate mask layer 153 may be formed using a material that has an etching selectivity with respect to the third conductive layer 143. For example, the gate mask layer 153 may be formed using a nitride such as silicon nitride, an oxynitride such as silicon oxynitride or titanium oxynitride, or an oxide such as silicon oxide. Further, the gate mask layer 153 may be formed, for example, by a CVD process, a PECVD process, an ALD process, an HDP-CVD process, a sputtering process, an electron beam evaporation process, a PLD process, etc.

In the formation of the third conductive layer 143 and/or the gate mask layer 153, the void 148 generated in the lower portion of the second conductive layer pattern 140 may move toward the gate insulation layer 120 adjacent to a channel region. The blocking member 130 effectively prevents the migration of the void 148 from making contact with the gate insulation layer 120 adjacent to the channel region. As a result, a recessed gate structure 160 (see FIG. 4H) may have improved electrical characteristics regardless of the presence of a void 148.

Figure 4H:
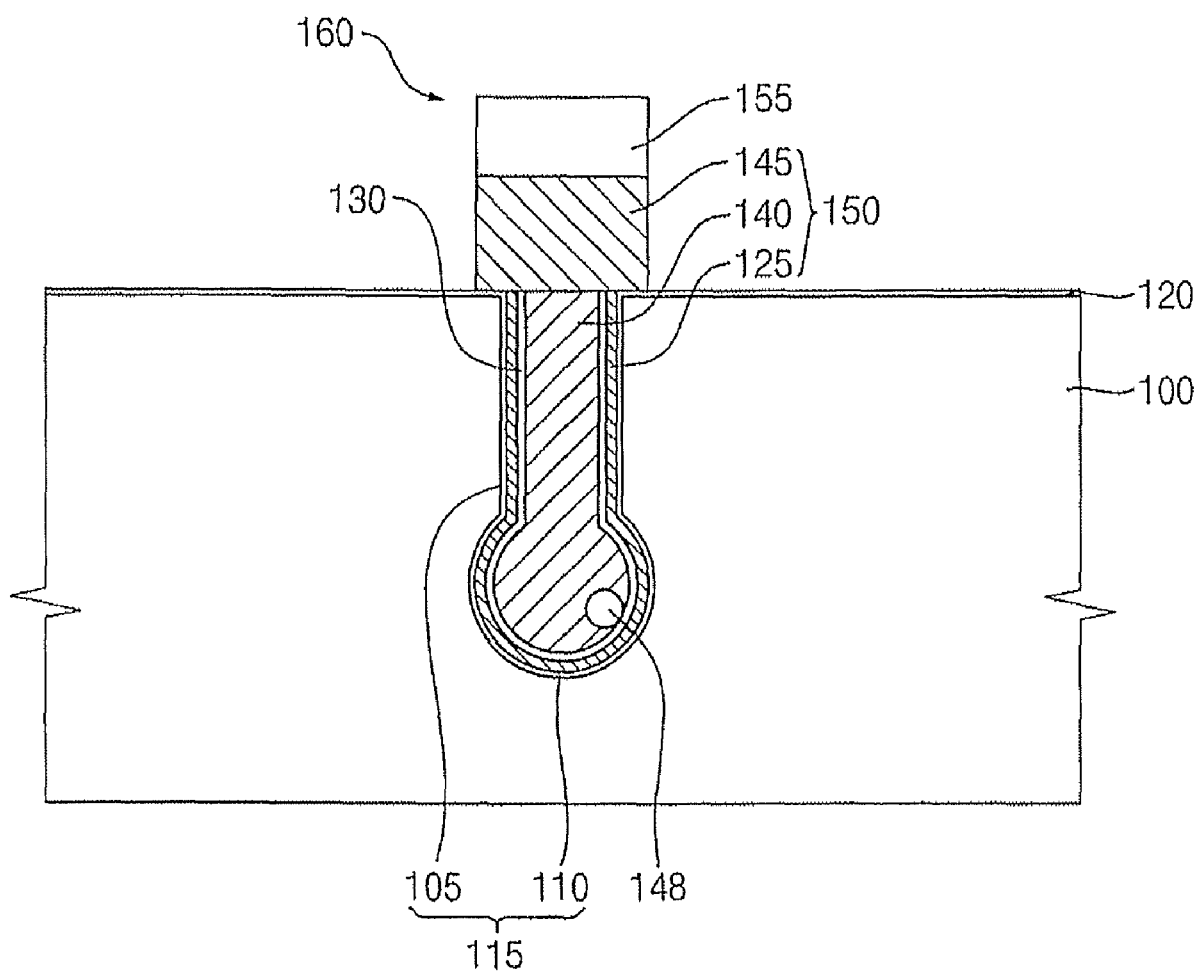

Referring to FIG. 4H, after a second photoresist pattern (not shown) is formed on the gate mask layer 153, the gate mask layer 153 is etched using the second photoresist pattern as an etching mask. Hence, a gate mask 155 is formed on a portion of the third conductive layer 143 directly over the second conductive layer pattern 140. The second photoresist pattern may be removed from the gate mask 155, for example, by an ashing process and/or a stripping process.

The third conductive layer 143 is partially removed using the gate mask 155 as an etching mask to form a third conductive layer pattern 145 on the second conductive layer pattern 140, the first conductive layer pattern 125, the gate insulation layer 120 and the blocking member 130. Thus, a gate electrode 150 having the first to the third conductive layer patterns 120, 140 and 145 is formed on the substrate 100. The gate mask 155 is positioned on the third conductive layer pattern 145. When the gate electrode 150 is formed, the recessed gate structure 160 having the gate insulation layer 120, the gate electrode 150 and the gate mask 155 is completed on the substrate 100.

As for the recessed gate structure 160, the first and the second conductive layer patterns 125 and 140 are buried in the recess structure 115 whereas the third conductive layer pattern 145 are protruded from the substrate 100. That is, a lower portion of the recessed gate structure 160 is buried in the substrate 100 while an upper portion of the recessed gate structure 160 protrudes upwardly from the substrate 100. Since the blocking member 130 encloses the second conductive layer pattern 140 in the recess structure 115, the third conductive layer pattern 145 is positioned on the blocking member 115, the second conductive layer pattern 140 and the first conductive layer pattern 120.

According to some embodiments of the present invention, the blocking member 130 is formed in the lower portion of the recessed gate structure 160 buried in the substrate 100. The blocking member 130 efficiently blocks the movement of a void 148 toward the gate insulation layer 120 so that the recessed gate structure 160 may have enhanced electrical characteristics.

Figure 5:
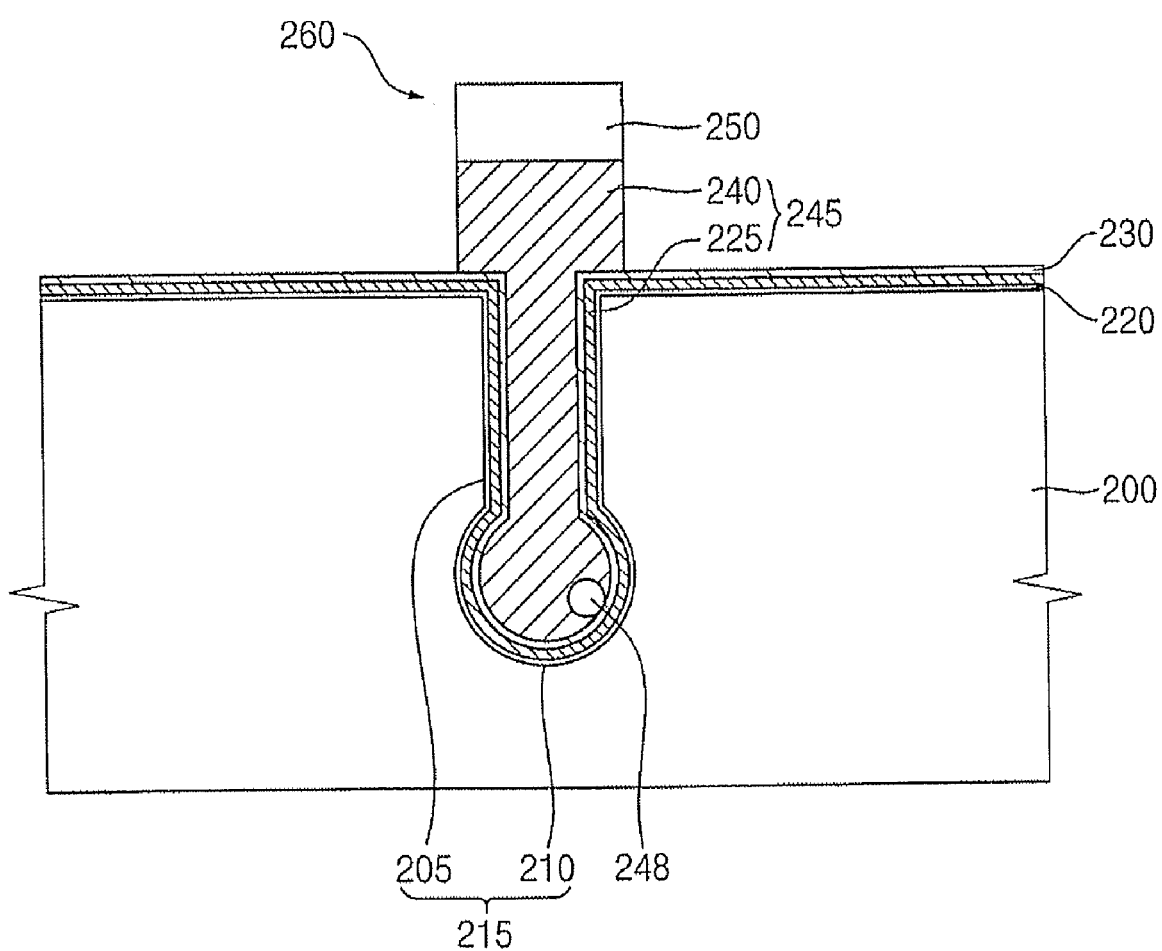
FIG. 5 is a cross-sectional view illustrating a recessed gate structure in accordance with some embodiments of the present invention.

FIG. 5 is a cross-sectional view illustrating a recessed gate structure in accordance with some embodiments of the present invention.

Referring to FIG. 5, a recessed gate structure 260 includes a gate insulation layer 220, a blocking member 230, a gate electrode 245 and a gate mask 250.

The gate electrode 245 has a lower portion buried in a substrate 200 and an upper portion protruded from the substrate 200. Particularly, the lower portion of the gate electrode 245 is buried in a recess structure 215 formed at an upper portion of the substrate 200.

The recess structure 215 includes a first recess 205 and a second recess 210 formed in the upper portion of the substrate 200. The substrate 200 may correspond to a silicon wafer or an SOI substrate. The first recess 205 may be formed from a surface of the substrate 200 along a first direction substantially perpendicular relative to the substrate 200. The second recess 210 may be formed beneath the first recess 205 in the first direction and a second direction substantially perpendicular to the first direction. For example, the second recess 210 may be enlarged along a vertical direction and a horizontal direction with respect to the substrate 200. The second recess 210 may have a width substantially wider than a width of the first recess 205 whereas a depth of the second recess 210 may be substantially shallower than a depth of the first recess 205.

The gate insulation layer 220 is formed on surfaces of the recess structure 215 and the substrate 200. In particular, the gate insulation layer 220 is positioned on the substrate 200, a surface of the first recess 205 and a surface of the second recess 210. For example, the gate insulation layer 220 may have a thickness of about 50 Å to about 100 Å based on upper faces of the recess structure 215 and the substrate 200. The gate insulation layer 220 may include oxide or metal oxide having a high dielectric constant.

The gate electrode 245 includes a first conductive layer 225 and a second conductive layer pattern 240.

The first conductive layer 225 is formed on the gate insulation layer 220 to partially fill up the recess structure 215. The recess structure 215 is sufficiently filled with the second conductive layer pattern 240. The second conductive layer pattern 240 is protruded from the substrate 200. The first conductive layer 225 extends along a surface of the recess structure 215 and a surface of the substrate 200. The first conductive layer 225 and the second conductive layer pattern 240 may include polysilicon doped with impurities. The first conductive layer may have a thickness of about 100 Å to about 200 Å measured from an upper face of the gate insulation layer 220.

The blocking member 230 is disposed on the first conductive layer 225. Particularly, the blocking member 230 is located between the first conductive layer 225 and the second conductive layer pattern 240 in the recess structure 215. Additionally, the blocking member 230 extends on the first conductive layer 225, which is disposed on the gate insulation layer 220 positioned on the substrate 200. According to some embodiments of the present invention, the blocking member 230 may have an area substantially the same as that of the gate insulation layer 220.

The blocking member 230 may include a metal silicide. For example, the blocking member 230 may include tungsten silicide ($WSi_x$), titanium silicide ($TiSi_x$), tantalum silicide ($TaSi_x$), cobalt silicide ($CoSi_x$), etc. The blocking member 230 may have a thickness of about 10 Å to about 50 Å based on an upper face of the first conductive layer 225. Therefore, a thickness ratio among the gate insulation layer 220, the first conductive layer 225 and the blocking member 230 may be in a range of about 1.0:1.0 to 4.0:0.1 to 1.0.

Since the second conductive layer pattern 240 of the gate electrode 245 has a lower portion buried in the recess structure 215, a void 248 or a seam may occur in the lower portion of the second conductive layer pattern 240. The blocking member 230 blocks the void 248 or the seam from moving toward a channel region so that the void 248 or the seam is separated from the gate insulation layer 220 adjacent to the channel region. Additionally, because the blocking member 230 includes the metal silicide, an interface resistance between the second conductive layer pattern 240 and the blocking member 230 may be reduced. Furthermore, the blocking member 230 extends along a surface of the recess structure 215 and an upper face of the substrate 200 so that the blocking member 230 may sufficiently enclose the second conductive layer pattern 240.

The gate mask 250 is formed on the second conductive layer pattern 240 of the gate electrode 245. The gate mask 250 serves as an etching mask for forming the gate electrode 245 and also electrically insulates the gate electrode 245 from an upper wiring in a semiconductor device.

FIGS. 6A to 6E are cross-sectional views illustrating a method of forming a recessed gate structure in accordance with example embodiments of the present invention.

Figure 6A:
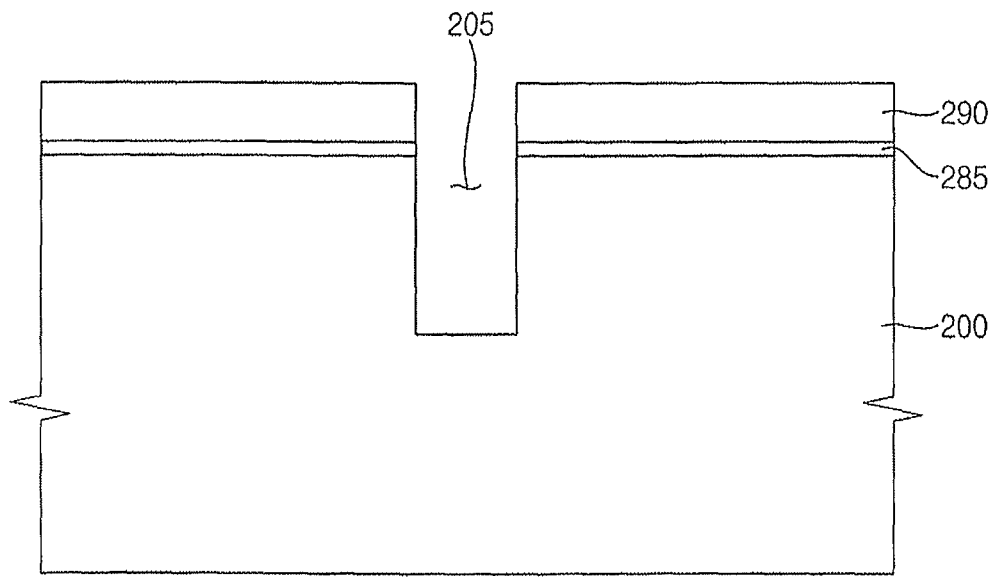
FIGS. 6A to 6E are cross-sectional views illustrating a method of forming a recessed gate structure in accordance with some embodiments of the present invention.

Referring to FIG. 6A, a buffer oxide layer (not shown) and a first mask layer (not shown) are successively formed on a substrate 200, and then the first mask layer is etched by a photolithography process to form a first mask 290 on the buffer oxide layer.

The buffer oxide layer may be formed, for example, by a thermal oxidation process, a CVD process, a PECVD process, an HDP-CVD process, etc. The first mask 290 may be formed using oxynitride by a CVD process, a PECVD process, an ALD process, a sputtering process, an electron beam evaporation process, a PLD process, etc.

The buffer oxide layer and the substrate 200 are partially etched by a first etching process using the first mask 290 as an etching mask so that a first recess 205 is formed at an upper portion of the substrate 200 and a buffer oxide layer pattern 285 is formed on the substrate 200. The first etching process may include an anisotropic etching process such as a wet anisotropic etching process or a dry anisotropic etching process. The first recess 205 may be formed in a perpendicular direction from a surface of the substrate 200.

Figure 6B:
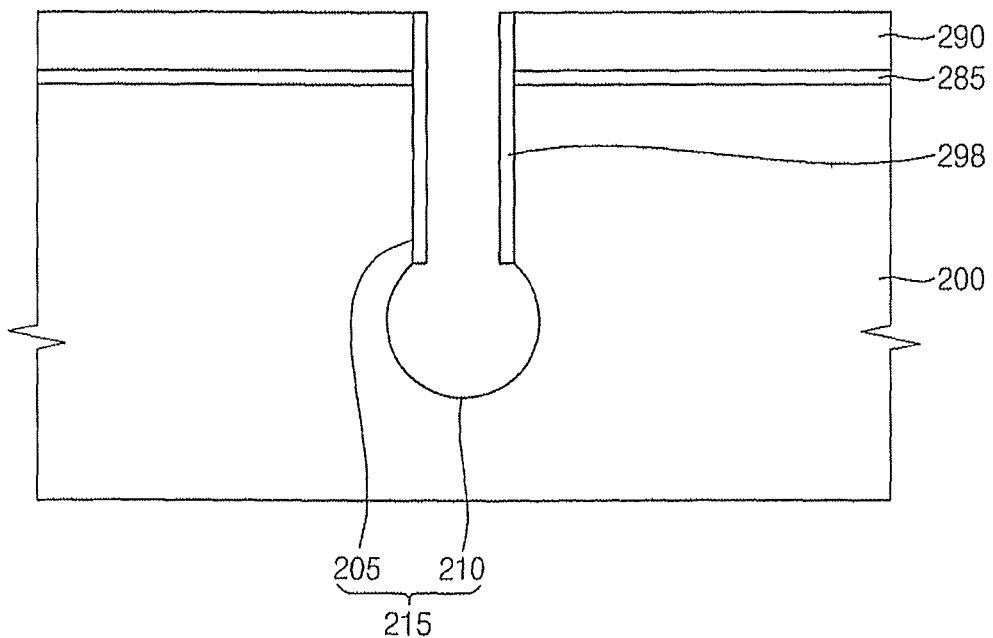

Referring to FIG. 6B, a second mask layer (not shown) is formed on a bottom and a sidewall of the first recess 205 and on the first mask 290. The second mask layer is partially etched to form a second mask 298 on the sidewall of the first recess 205. That is, portions of the second mask layer on the bottom of the first recess 205 and the first mask 290 are removed to form the second mask 298 on the sidewall of the first recess 205 only. The second mask 298 may be formed using, for example, oxide, nitride or oxynitide by a CVD process, an ALD process, a PECVD process, an HDP-CVD process, a sputtering process, an electron beam evaporation process, a PLD process, etc.

With a second etching process using the second mask 298 as an etching mask, a portion of the substrate 200 exposed through the first recess 205 is etched along a vertical direction and a horizontal direction so that a second recess 210 is formed beneath the first recess 205. The second recess 210 may be formed by a dry isotropic etching process or a wet isotropic etching process. Thus, a recess structure 215 having the first and the second recesses 205 and 210 is formed at the upper portion of the substrate 200. The second recess 210 may have a cross section that has a circular shape, an elliptical shape, a track shape, etc.

Figure 6C:
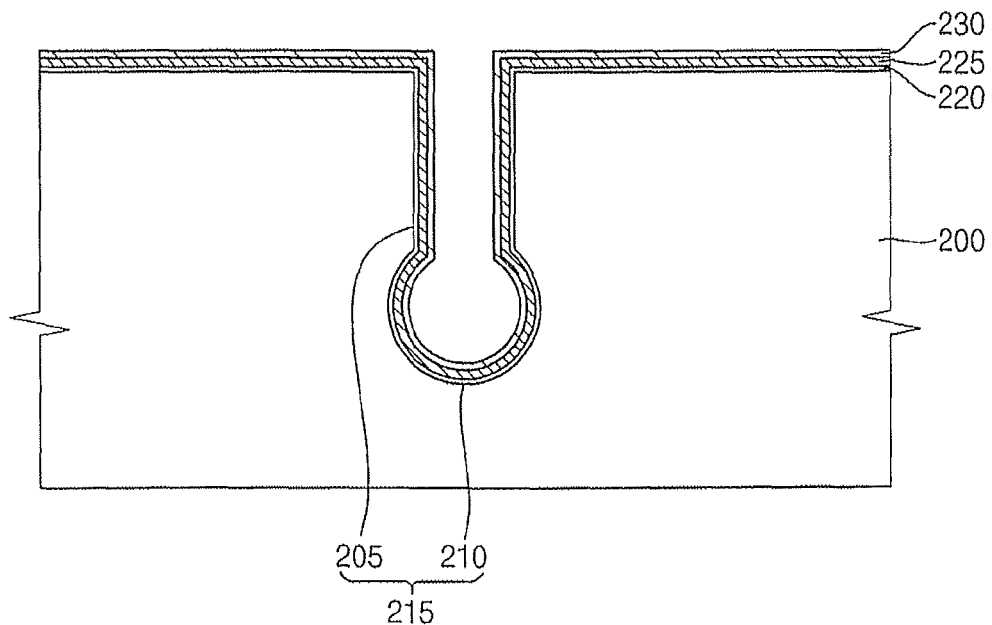

Referring to FIG. 6C, after the second mask 298, the first mask 290 and the buffer oxide layer pattern 285 are successively removed, a gate insulation layer 220 is formed on surfaces of the recess structure 215 and an upper face of the substrate 200. The gate insulation layer 220 may be formed using, for example, oxide or metal oxide by a thermal oxidation process, a CVD process, a PECVD process, an ALD process, an HDP-CVD process, etc. The gate insulation layer 220 extends along the surfaces of the recess structure 215 and the upper face of the substrate 200.

A first conductive layer 225 is formed on the gate insulation layer 220 to partially fill up the recess structure 215. The first conductive layer 225 may be formed, for example, using doped polysilicon or metal by a CVD process, a PECVD process, an ALD process, a sputtering process, a PLD process, an electron beam evaporation process, etc. When the first conductive layer 225 is formed using polysilicon doped with impurities, the impurities may be doped, for example, by an ion implantation process, a diffusion process or an in-situ doping process. The first conductive layer 225 may have a length substantially the same as that of the gate insulation layer 220. Namely, the first conductive layer 225 extends along the surfaces of the recess structure 215 and the upper face of the substrate 200.

A blocking member 230 is formed on the first conductive layer 225. According to some embodiments of the present invention, the blocking member 230 may be formed using metal silicide, for example, by a CVD process, an ALD process, a PECVD process, a PLD process, an electron beam evaporation process, a sputtering process, etc. According to some embodiments of the present invention, the blocking member 230 may be formed on the first conductive layer 225 using a silicidation process on a surface of the first conductive layer 225.

The blocking member 230 may have a length substantially the same as that of the gate insulation layer 220. That is, the blocking member 230 may be formed along the surfaces of the recess structure 215 and the upper face of the substrate 200.

Figure 6D:
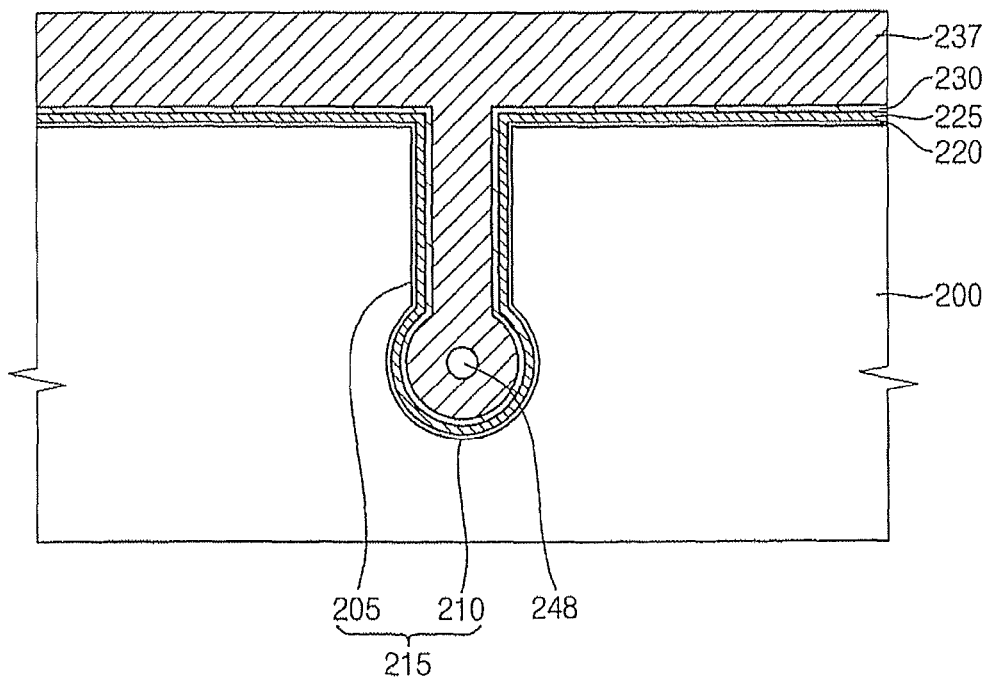

Referring to FIG. 6D, a second conductive layer 237 is formed on the blocking member 230 to fully fill up the recess structure 215. The second conductive layer 237 may be formed using, for example, doped polysilicon, tungsten, aluminum, tantalum, titanium, copper, etc. Additionally, the second conductive layer 237 may be formed, for example, by a CVD process, a PECVD process, an ALD process, a sputtering process, an electron beam evaporation process, a PLD process, etc.

During forming of the second conductive layer 237, a void 248 or a seam may occur in a lower portion of the second conductive layer 237 because the lower portion of the second conductive layer 237 is formed in the enlarged second recess 210.

Figure 6E:
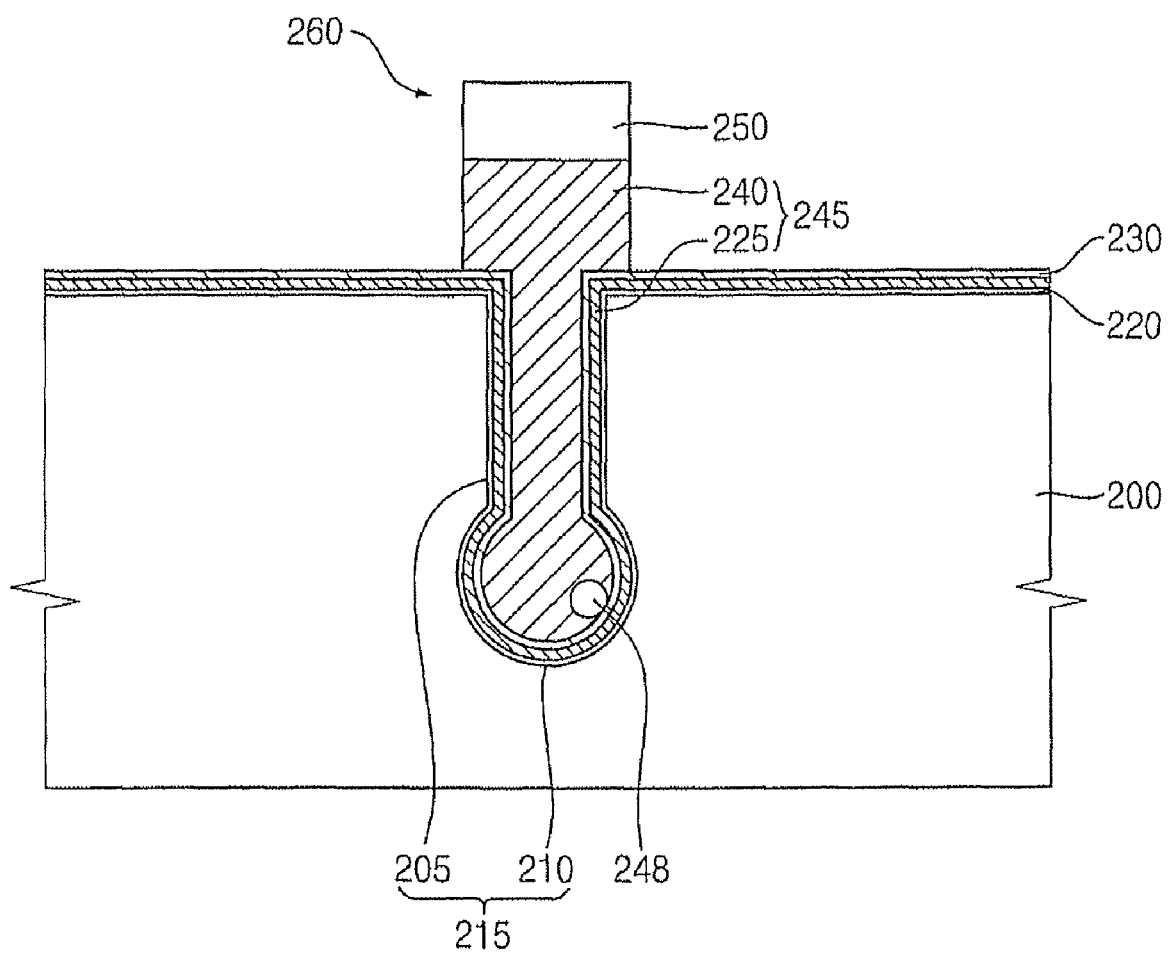

Referring to FIG. 6E, after a gate mask layer (not shown) is formed on the second conductive layer 237, the gate mask layer is partially etched to form a gate mask 250 on the second conductive layer 237. The gate mask 250 may be formed, for example, using nitride, oxynitride or oxide by a CVD process, a PECVD process, an ALD process, an HDP-CVD process, a sputtering process, an electron beam evaporation process, a PLD process, etc.

When the gate mask 250 is formed on the second conductive layer 237, the void 248 or the seam formed in the lower portion of the second conductive layer 237 may move toward the gate insulation layer 220 adjacent to a channel region. Here, the blocking member 230 sufficiently prevents the void 248 or the seam from moving toward the gate insulation layer 220. Therefore, a recessed gate structure 260 may have improved electrical characteristics although the void 248 or the seam occurs in the gate electrode 245.

The second conductive layer 237 is partially removed using the gate mask 250 as an etching mask to form a second conductive layer pattern 240. The second conductive layer pattern 240 includes an upper portion that protrudes over the substrate 200 and the lower portion buried in the recess structure 215. Hence, the recessed gate structure 260 having the gate insulation layer 220, the gate electrode 245, the blocking member 230 and the gate mask 250 is completed on the substrate 200. The gate electrode 245 includes the first conductive layer 225 and the second conductive layer pattern 240.

Semiconductor Device and Method of Manufacturing the Same

Figure 7:
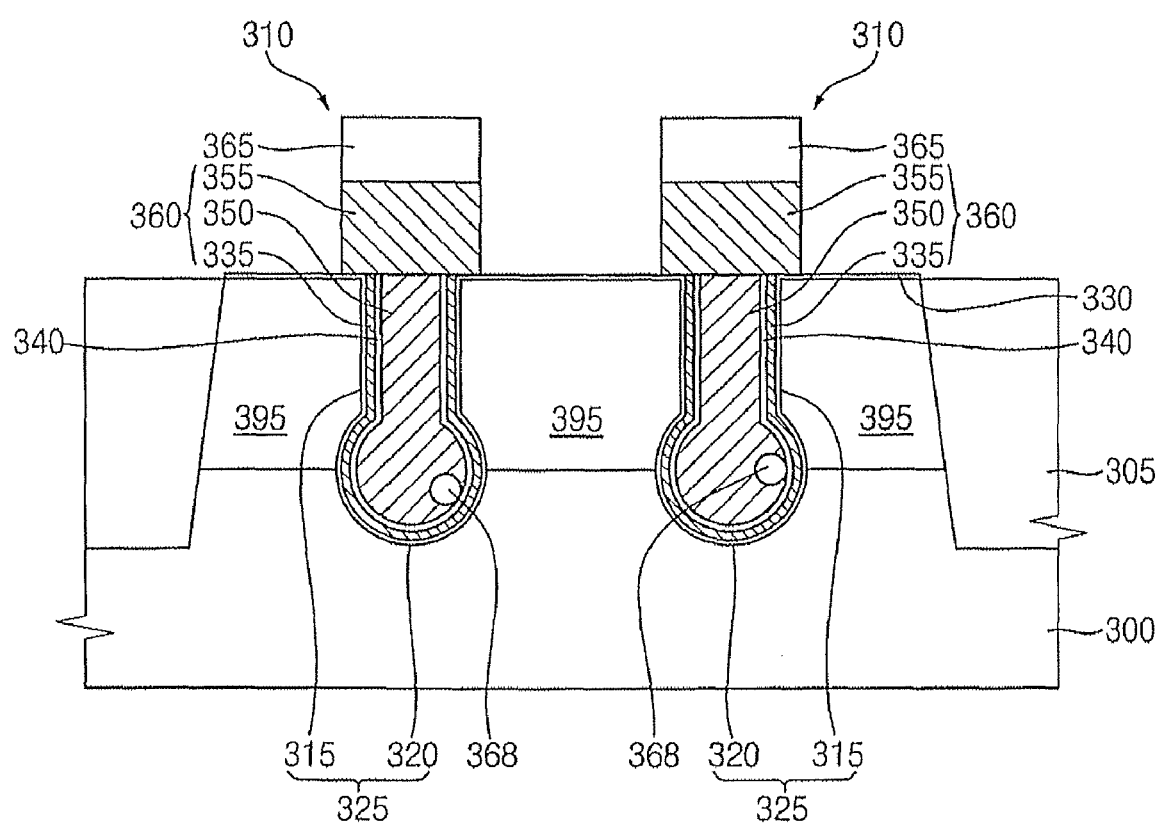
FIG. 7 is a cross-sectional view illustrating a semiconductor device including a recessed gate structure in accordance with some embodiments of the present invention.

FIG. 7 is a cross-sectional view illustrating a semiconductor device having a recessed gate structure in accordance with some embodiments of the present invention.

Referring to FIG. 7, the semiconductor device includes a recessed gate structure 310 partially buried in a semiconductor substrate 300, and source/drain regions 395 formed at portions of the semiconductor substrate 300 adjacent to the recessed gate structure 310.

The recessed gate structure 310 has a gate insulation layer 330, a blocking member 340, a gate electrode 360 and a gate mask 365.

The source/drain regions 395 may have depths substantially the same as a depth of a portion of the gate electrode 360 having a maximum width in the semiconductor substrate 300.

An isolation layer 305 is formed on the semiconductor substrate 300 to define an active region and a field region. The isolation layer 305 may include an oxide such as silicon oxide.

A recess structure 325 having a first recess 315 and a second recess 320 is formed in the active region of the semiconductor substrate 300. The first recess 315 is formed vertically from a direction along which an upper face of the substrate 300 stretches. The second recess 320 is vertically and horizontally enlarged beneath the first recess 315. The second recess 320 has a width greater than that of the first recess 315 so that the recess structure 325 has an enlarged lower portion. The second recess 320 may be enlarged in a circular shape, an elliptical shape or a track shape.

The gate insulation layer 330 is formed on the active region of the substrate 300 and a surface of the recess structure 325. The gate insulation layer 330 is formed along the surface of the recess structure 325 and an upper face of the active region of the substrate 300. The gate insulation layer 330 may include oxide or metal oxide.

The gate electrode 360 includes a first conductive layer pattern 335, a second conductive layer pattern 350 and a third conductive layer pattern 355.

The first conductive layer pattern 335 partially fills up the recess structure 325 and only locates on a portion the gate insulation layer 330 positioned on the recess structure 325. The first conductive layer pattern 335 may include doped polysilicon or metal.

The blocking member 340 is formed on the first conductive layer pattern 335. The blocking member 340 may include oxide. In one example embodiment of the present invention, the blocking member 340 may be formed by an oxidation of a surface of the first conductive layer pattern 335. In another example embodiment of the present invention, the blocking member 340 may be formed on the first conductive layer pattern 335 by depositing oxide on the first conductive layer pattern 335.

The second conductive layer pattern 350 is formed on the blocking member 340 to sufficiently fill up the recess structure 325. The blocking member 340 may enclose a lower portion of the second conductive layer pattern 350 positioned in the recess structure 325. The second conductive layer pattern 350 may include metal or polysilicon doped with impurities. Since the recess structure 325 has the enlarged second recess 320, the lower portion of the second conductive layer pattern 350 also has an enlarged cross section of the circular shape, the elliptical shape or the track shape. A void 368 is generated in the lower portion of the second conductive layer pattern 350. The void 368 may move toward a channel region of the semiconductor device formed along a lower portion of the gate electrode 360 adjacent to the source/drain regions 395 during subsequent manufacturing processes. However, the blocking member 340 effectively separates the void 368 from the channel region. Thus, the gate electrode 360 may have a regular threshold voltage (Vth) and a leakage current through the void 368 may be sufficiently prevented. Further, all transistors in a unit cell of the semiconductor device may have uniform threshold voltage to improve electrical characteristics of the semiconductor device.

The third conductive layer pattern 355 is located on the second conductive layer pattern 350. The gate electrode 360 having the third conductive layer pattern 355 includes a lower portion buried in the recess structure 325 and an upper portion protruded and on the upper face of the active region of the substrate 300. The third conductive layer pattern 355 may include doped polysilicon or metal.

The gate mask 365 is formed on the third conductive layer pattern 355. The gate mask 365 may include, for example, nitride, oxynitride or oxide. The gate mask 365 serves as an etching mask for forming the gate electrode 360. Additionally, the gate mask 365 electrically insulates the gate electrode 360 from upper wiring (not shown).

FIGS. 8A to 8F are cross-sectional views illustrating a method of manufacturing a semiconductor device having a recessed gate structure in accordance with some embodiments of the present invention.

Figure 8A:
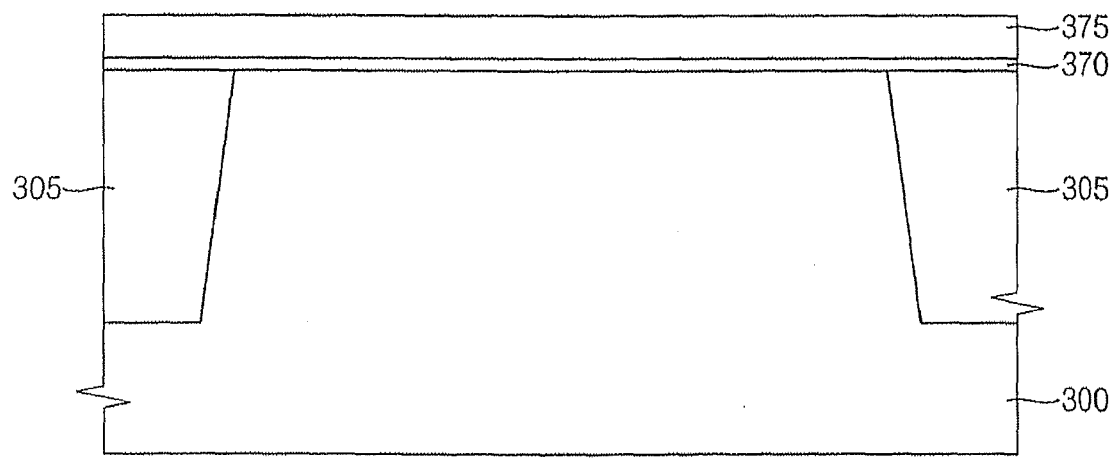
FIGS. 8A to 8F are cross-sectional views illustrating a method of manufacturing a semiconductor device including a recessed gate structure in accordance with some embodiments of the present invention.

Referring to FIG. 8A, an isolation layer 305 is formed on a semiconductor substrate 300 by an isolation process. An active region and a field region of the semiconductor substrate 300 are defined by the formation of the isolation layer 305. The isolation layer 305 may be formed, for example, through a shallow trench isolation (STI) process or a local oxidation of silicon (LOCOS) process.

A buffer oxide layer 370 is formed on the active region and the field region. The buffer oxide layer 370 may be formed by a thermal oxidation process or a CVD process. The buffer oxide layer 370 may protect the semiconductor substrate 300 during forming of a recess structure 325 (see FIG. 8C) in the semiconductor substrate 300.

A first mask layer 375 is formed on the buffer oxide layer 370 (see FIG. 8A). The first mask layer 375 may be formed using a material that has an etching selectivity with respect to the buffer oxide layer 370 and the substrate 300. For example, the first mask layer 375 may be formed using nitride or oxynitride such as silicon nitride, silicon oxynitride, titanium oxynitride, etc. The first mask layer 375 may be formed, for example, through a CVD process, an ALD process, a PECVD process, an HDP-CVD process, an electron beam evaporation process, a PLD process, a sputtering process, etc.

Figure 8B:
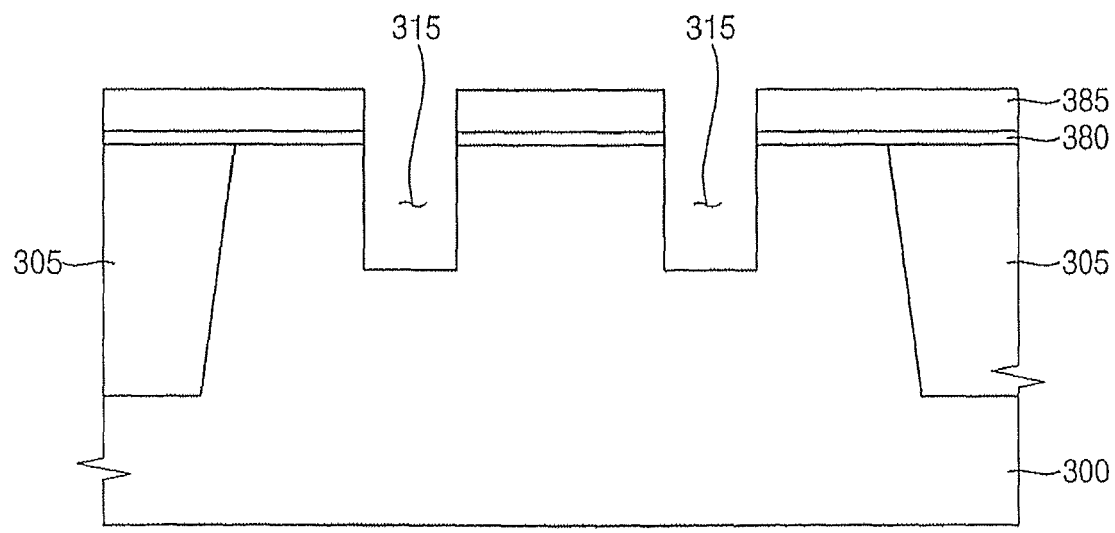

Referring to FIG. 8B, a first photoresist pattern (not shown) is formed on the first mask layer 375, and then the first mask layer 375 is patterned using the first photoresist pattern as an etching mask. Hence, a first mask 385 is formed on the buffer oxide layer 370. The first photoresist pattern may be removed from the first mask 385, for example, by an ashing process and/or a stripping process. The first mask 375 defines a portion of the semiconductor substrate 300 where a first recess 315 is formed. That is, the first mask 385 serves as an etching mask for forming the first recess 315 at an upper portion of the substrate 300.

By a first etching process that utilizes the first mask 385 as the etching mask, the buffer oxide layer 370 and the substrate 300 are partially etched to simultaneously form the first recess 315 and a buffer oxide layer pattern 380. The first recess 315 having a predetermined depth is formed at the upper portion of the substrate 300. The buffer oxide layer pattern 380 is located on an upper face of the substrate 300. The first etching process may include, for example, a dry etching process that uses an etching gas or a wet etching process using an etching solution. The first recess 315 is formed along a vertical direction relative to the substrate 300. When the first recess 315 is formed, a portion of the substrate 300 is exposed through the first recess 315.

Figure 8C:
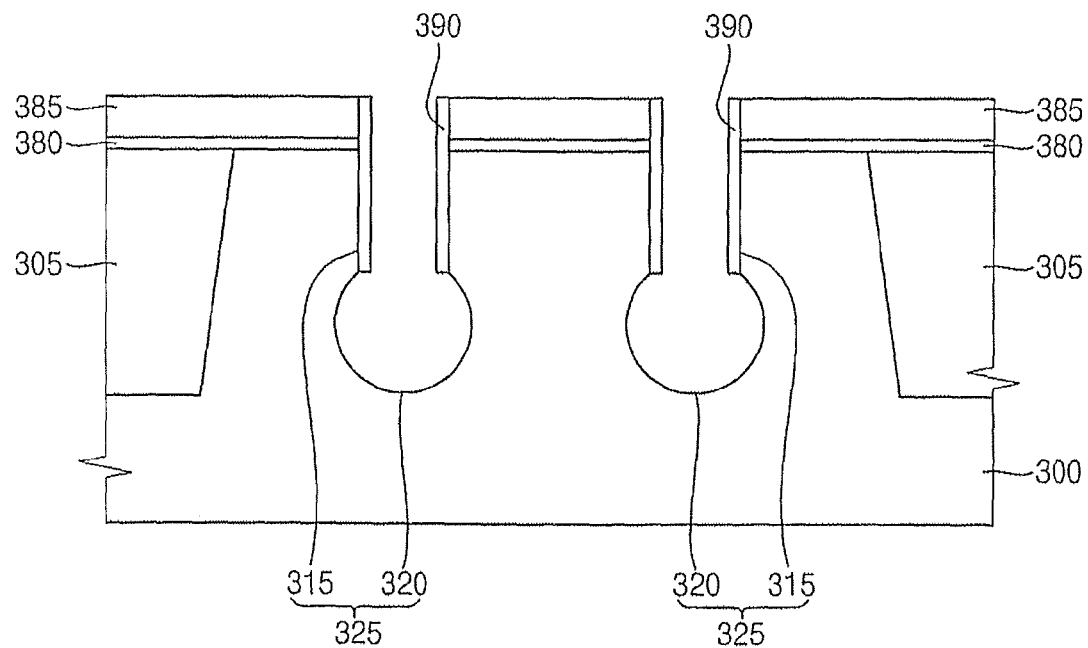

Referring to FIG. 8C, a second mask layer (not shown) is formed on the exposed portion of the substrate 300, sidewall of the first recess 315 and the first mask 370 (see FIG. 8A). The second mask layer may be formed using a material that has an etching selectivity with respect to the substrate 300. For example, the second mask layer may be formed using silicon oxide, silicon nitride, silicon oxynitride, titanium oxynitride, etc. Further, the second mask layer may be formed, for example, by a CVD process, a PECVD process, an ALD process, an HDP-CVD process, a PLD process, an electron beam evaporation process, a sputtering process, etc.

A second mask 390 is formed on the sidewall of the first recess 315 by removing portions of the second mask layer on the first mask 385 and exposing a portion of the substrate 300. The second mask 390 may be formed, for example, by an anisotropic etching process. When the second mask 390 is formed, the portion of the substrate 300 corresponding to the bottom of the first recess 315 is exposed again.

The exposed portion of the substrate 300 is etched by a second etching process using the second mask 390 as an etching mask so that a second recess 320 is formed beneath the first recess 315. For example, the second recess 320 may be formed by a dry isotropic etching process or a wet isotropic etching process. Since the second mask 390 protects the sidewall of the first recess 315, a portion of the substrate 300 corresponding to the sidewall of the first recess 315 is not etched in the formation of the second recess 320. Thus, the exposed portion of the substrate 300 is vertically and horizontally etched to form the second recess 320 having a width greater than that of the first recess 315. For example, the second recess 320 has an enlarged cross section in a circular shape, an elliptical shape or a track shape. Throughout the formation of the first and the second recesses 315 and 320, the recess structure 325 located in the active region of the substrate 300 has a lower portion enlarged in a rounded shape.

Figure 8D:
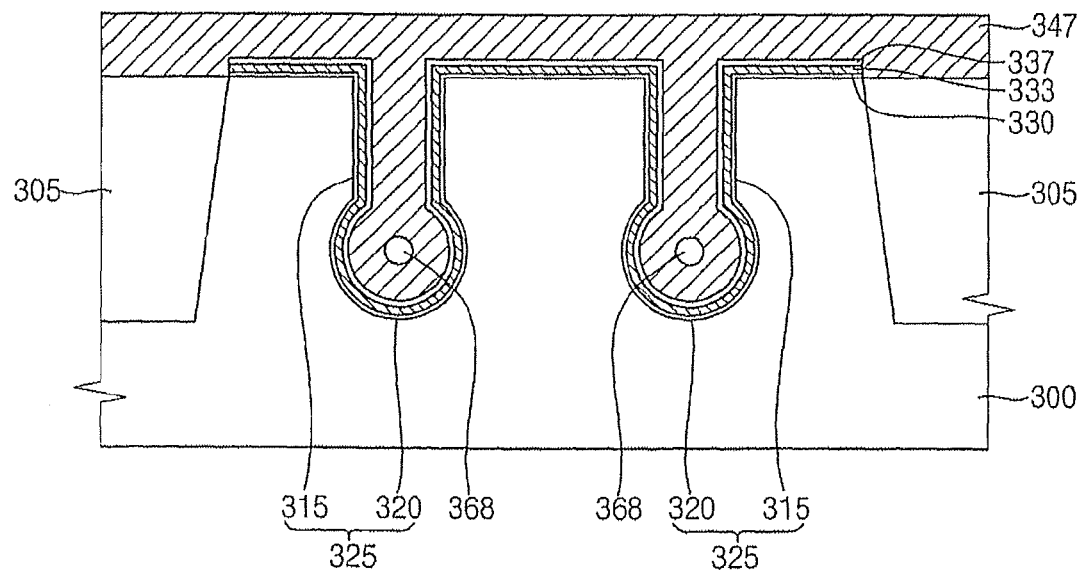

Referring to FIG. 8D, the first mask 385 and the buffer oxide layer pattern 380 are removed from the substrate 300 after the second mask 390 is removed from the sidewall of the first recess 315.

A gate insulation layer 330 is formed on the recess structure 325 and the active region. Particularly, the gate insulation layer 330 is formed along surfaces of the first and the second recesses 315 and 320 as well as an upper face of the active region of the substrate 300. The gate insulation layer 330 may be formed, for example, by a thermal oxidation process, a CVD process, an ALD process, a PECVD process, an HDP-CVD process, etc. The gate insulation layer 330 may be formed using oxide or metal oxide having a high dielectric constant. For example, the gate insulation layer 330 may have a thickness of about 50 Å to about 100 Å based on an upper face of the recess structure 325.

A first conductive layer 333 is formed on the gate insulation layer 330 with which the recess structure 325 is coated. The first conductive layer 333 may be formed using doped polysilicon or metal. The first conductive layer 333 may have a thickness of about 100 Å to about 200 Å based on an upper face of the gate insulation layer 330. The first conductive layer 333 may be formed, for example, by a CVD process, a PECVD process, an ALD process, a sputtering process, an electron beam evaporation process, a PLD process, etc. Impurities may be doped, for example, by an ion implantation process, a diffusion process or an in-situ doping process when the first conductive layer 333 is formed using polysilicon doped with the impurities.

A preliminary blocking member 337 is formed on the first conductive layer 333. The preliminary blocking member 337 may be formed using oxide. The preliminary blocking member 337 may have a thin thickness of about 10 Å to about 50 Å measured from an upper face of the first conductive layer 333. The preliminary blocking member 337 may be formed by oxidizing an upper portion of the first conductive layer 330. Alternatively, the preliminary blocking member 337 may be formed by depositing oxide on the first conductive layer 330. Here, the preliminary blocking member 337 may be formed, for example, by a CVD process, a PECVD process, an ALD process, an HDP-CVD process, etc.

A second conductive layer 347 is formed on the substrate 300 and the preliminary blocking member 337 to sufficiently fill up the recess structure 325. The second conductive layer 347 may be formed using doped polysilicon or metal. The second conductive layer 347 may be formed, for example, by a CVD process, a PECVD process, an ALD process, a sputtering process, an electron beam evaporation process, a PLD process, etc. Since the second conductive layer 347 fills up the recess structure 215 having the enlarged lower portion, a void 368 is formed in a lower portion of the second conductive layer 347.

Figure 8E:
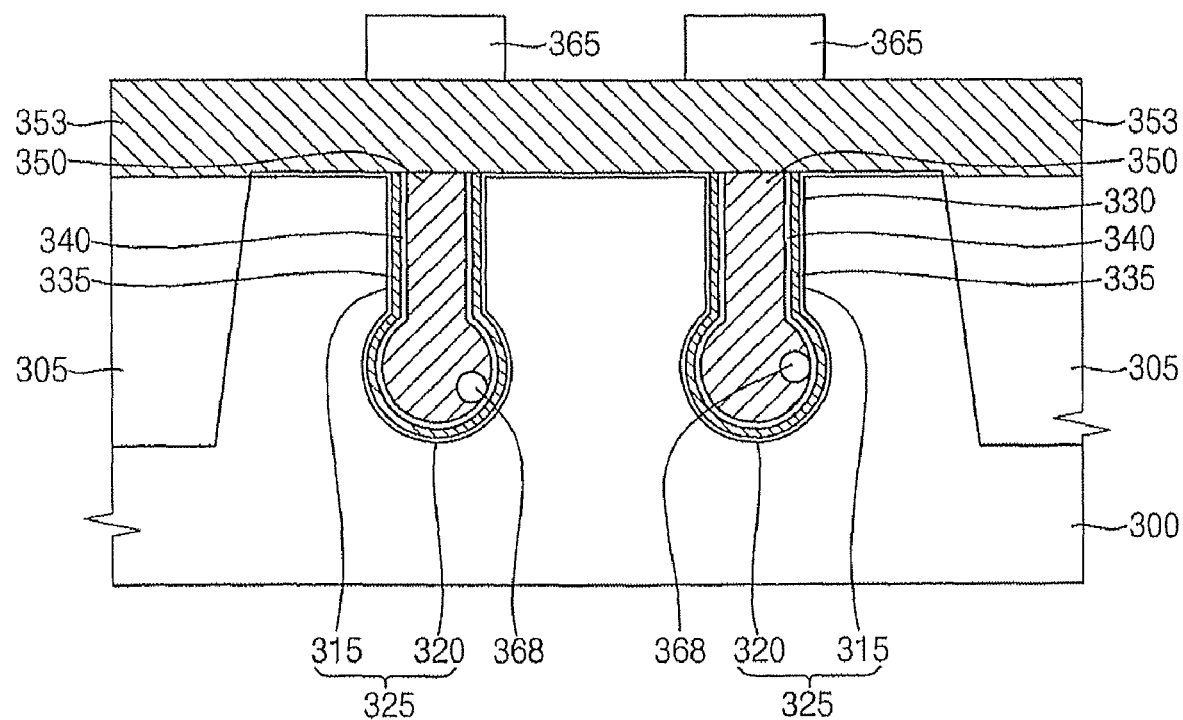
Figure 8F:
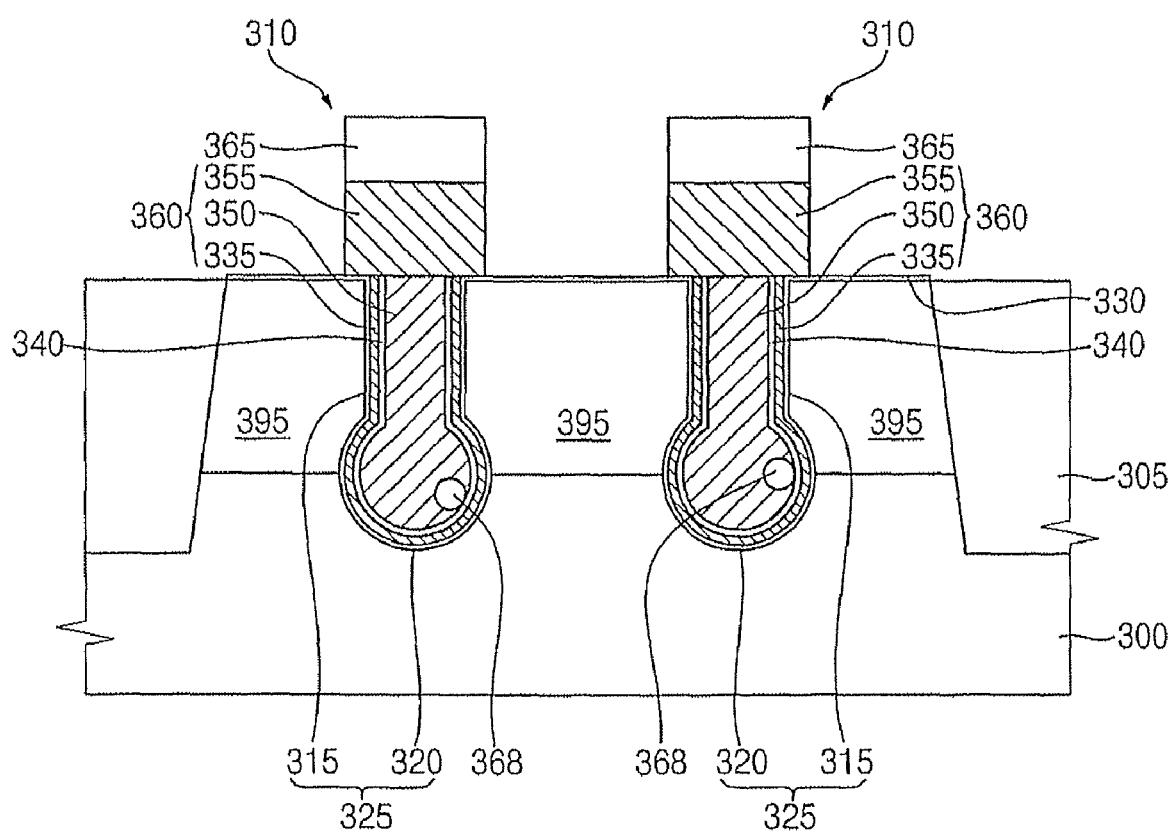

Referring to FIG. 8E, a portion of the second conductive layer 347 on the substrate 300 is removed to expose the preliminary blocking member 337. On the other hand, the lower portion of the second conductive layer 347 remains in the recess structure 325. The second conductive layer 347 may be partially removed by an etch-back process. As a result, a second conductive layer pattern 350 is formed to be buried in the recess structure 325.

A portion of the preliminary blocking member 337 on the substrate 300 is etched to form a blocking member 340 on the first conductive layer 333 in the recess structure 325. The blocking member 340 may be formed, for example, using an etching solution containing fluorine (F) or an etching gas including fluorine.

A portion of the first conductive layer 333 on the active region is exposed after the formation of the blocking member 340. The exposed portion of the first conductive layer 333 is removed to form a first conductive layer pattern 335 between the blocking member 340 and the gate insulation layer 330. The first conductive layer pattern 335 may be formed by an etch-back process. When the first conductive layer pattern 335 is formed in the recess structure 325, a portion of the gate insulation layer 330 on the active region is exposed. The blocking member 340 encloses the second conductive layer pattern 350, and the first conductive layer pattern 335 encloses the blocking member 340. Additionally, the gate insulation layer 330 encloses the first conductive layer pattern 335.

Still referring to FIG. 8E, a third conductive layer 353 is formed on the second conductive layer pattern 350 and the exposed portion of the gate insulation layer 330. In particular, the third conductive layer 353 is formed on the first conductive layer pattern 335, the blocking member 340, the second conductive layer pattern 350 and the exposed portion of the gate insulation layer 330. The third conductive layer pattern 353 may be formed, for example, using doped polysilicon or metal. According to some embodiments of the present invention, the third conductive layer pattern 353 may have a polycide structure that includes a polysilicon film pattern and a metal silicide film pattern. The third conductive layer pattern 353 may be formed, for example, by a CVD process, a PECVD process, an ALD process, a sputtering process, an electron beam process, a PLD process, etc.

After a gate mask layer (not shown) is formed on the third conductive layer pattern 353, a second photoresist pattern (not shown) is formed on the gate mask layer. The gate mask layer may be formed using a material having an etching selectivity with respect to the third conductive layer pattern 353. For example, the gate mask layer may be formed using nitride, oxide or oxynitride. The gate mask layer may be formed, for example, by a CVD process, a PECVD process, an ALD process, an HDP-CVD process, an electron beam evaporation process, a sputtering process, a PLD process, etc.

Using the second photoresist pattern as an etching mask, the gate mask layer is patterned to form a gate mask 365 included in a gate electrode 360 (see FIG. 8F) on the third conductive layer 353.

In the processes for forming the third conductive layer 353 and/or the gate mask 365, the void 368 formed in the lower portion of the second conductive layer pattern 350 moves toward the gate insulation layer 330 adjacent to the second conductive layer pattern 350.

Figure 9:
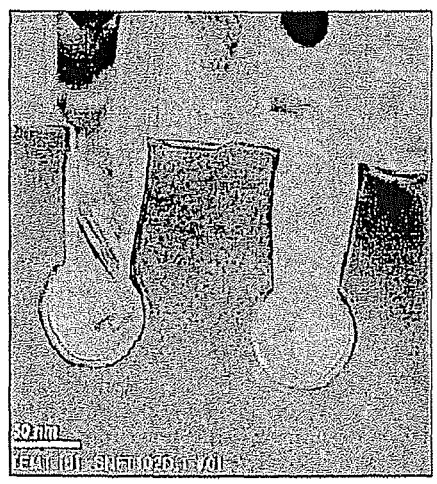
FIG. 9 is an electron microscopic picture illustrating a semiconductor device including a recessed gate structure in accordance with some embodiments of the present invention.

FIG. 9 is an electron microscopic picture illustrating a cross section of a semiconductor device in accordance with some embodiments of the present invention.

As shown in FIG. 9, the blocking member 340 enclosing the second conductive layer pattern 350 prevents the migration of the void 368 so that the void 368 does not make contact with the gate insulation layer 330 around the second conductive layer pattern 350. Namely, the void 368 is separated from the gate insulation layer 330 by the blocking member 340.

Referring back to FIG. 8F, the third conductive layer 353 is partially etched using the gate mask 365 as an etching mask to thereby form a third conductive layer pattern 355 on the second conductive layer pattern 350 and the gate insulation layer 330. The third conductive layer pattern 355 may have a length substantially greater than that of the second conductive layer pattern 350. In the formation of the third conductive layer pattern 355, the gate electrode 360 having the first to the third conductive layer patterns 335, 350 and 355 is formed in the active region of the substrate 300. Additionally, a recessed gate structure 310 is completed on the substrate 300. The recessed gate structure 310 includes the gate insulation layer 330, the blocking member 340, the gate electrode 360 and the gate mask 365.

In an ion implantation process that utilizes the gate mask 365 and the third conductive layer pattern 355 as masks, impurities are implanted into portions of the active region adjacent to the gate electrode 360 so that source/drain regions 395 are formed in the active region. As a result, the semiconductor device having the recessed gate structure 310 and the source/drain regions 395 is formed on the substrate 300.

Figure 10:
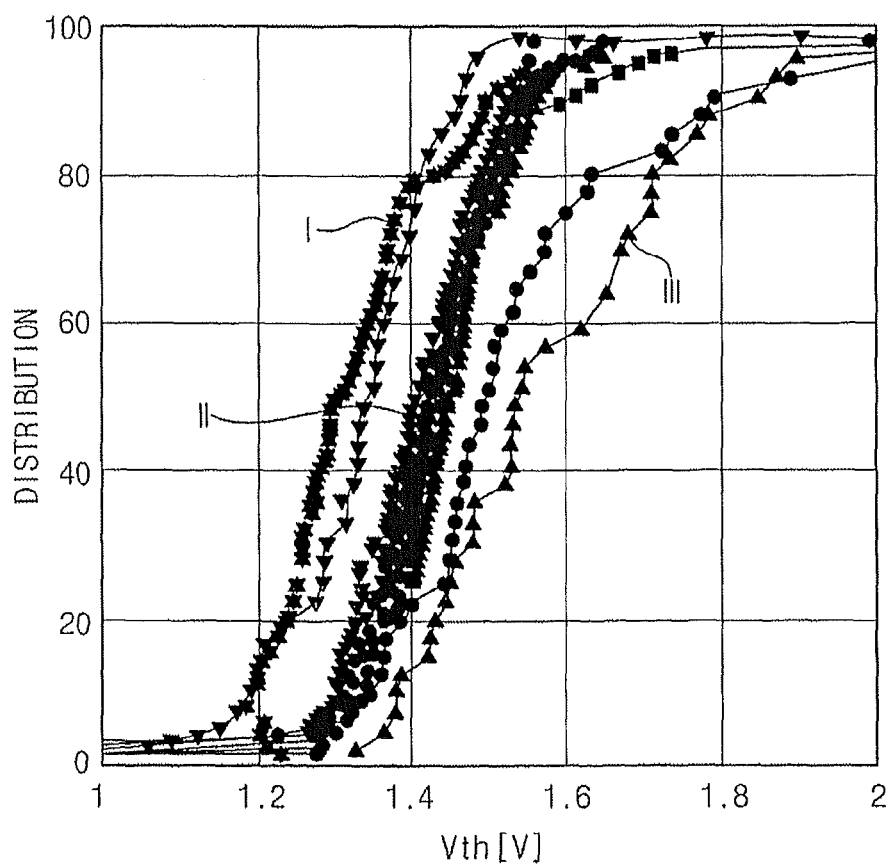
FIG. 10 is a graph illustrating the distribution of threshold voltages of transistors including recessed gate structures.

FIG. 10 is a graph illustrating the distributions of threshold voltages of transistor in a unit cell of a semiconductor device. In FIG. 10, a first line I indicates the distributions of threshold voltages in conventional transistors, and a second line II represents the distributions of threshold voltages in transistors according to some embodiments of the present invention. Additionally, a third line III denotes the distributions of threshold voltages in conventional transistors having enlarged recessed gate electrodes with voids therein.

Referring to FIG. 10, the conventional transistors have irregular threshold voltages of about 1.2V to about 1.8V. When transistors in a unit cell of a semiconductor device have irregular threshold voltages, the semiconductor device may be not properly operated with a predetermined voltage so that the electrical characteristics of the semiconductor device may be deteriorated. However, the transistors of the present invention have uniform threshold voltages of about 1.3V to about 1.5V. Thus, the semiconductor device including the transistors of the present invention may have considerably improved electrical characteristics.

Figure 11:
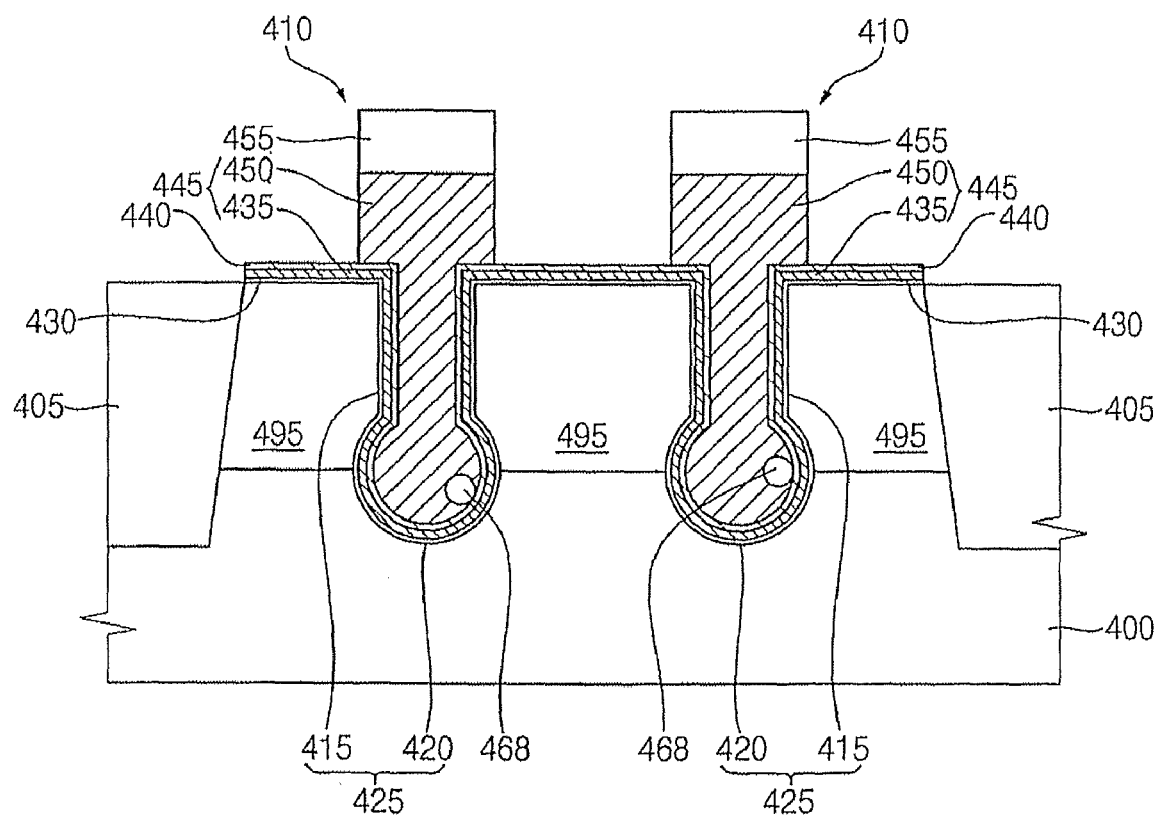
FIG. 11 is a cross-sectional view illustrating a semiconductor device including a recessed gate structure in accordance with some embodiments of the present invention.

FIG. 11 is a cross-sectional view illustrating a semiconductor device having a recessed gate structure in accordance with some embodiments of the present invention.

Referring to FIG. 11, the semiconductor device includes a recessed gate structure 410 partially buried in a substrate 400 having a recessed structure 410, and source/drain regions 495 formed at portions of the substrate 400 adjacent to the recessed gate structure 410.

The recessed gate structure 410 has a gate insulation layer 430, a blocking member 430, a gate electrode 445 and a gate mask 455. The gate electrode 445 has a first conductive layer 435 and a second conductive layer pattern 450. The first conductive layer 435 is formed along surfaces of the recessed structure 410 and an upper face of the substrate 400. A lower portion of the second conductive layer pattern 450 is buried in the recessed structure 410, whereas an upper portion of the second conductive layer pattern 450 protrudes over the substrate 400.

An isolation layer 405 is formed on the substrate 400 to define an active region and a field region. The recess structure 410 is formed in the active region of the substrate 400. The recess structure 410 includes a first recess 415 and a second recess 420. The first recess 415 is vertically formed at an upper portion of the active region of the substrate 400. The second recess 420 is vertically and horizontally enlarged beneath the first recess 415. The second recess 420 has an enlarged cross section of a circular shape, an elliptical shape or a track shape.

The gate insulation layer 430 is formed along a surface of the recess structure 410 and an upper face of the active region of the substrate 400. The gate insulation layer 430 may include oxide or metal oxide.

The first conductive layer 435 of the gate electrode 445 is formed on the gate insulation layer 430 to partially fill up the recess structure 410. The first conductive layer 435 is formed from the recess structure 410 to the substrate 400. The first conductive layer 435 may include metal or polysilicon doped with impurities.

The blocking member 440 is formed on the first conductive layer 435. The blocking member 440 extends from the recess structure 410 over the substrate 400. Thus, the blocking member 440, the first conductive layer 435 and the gate insulation layer 430 may have substantially the same lengths. The blocking member 440 may include metal silicide. According to some embodiments of the present invention, the blocking member 440 may be formed by depositing metal silicide on the first conductive layer 435. According to some embodiments of the present invention, the blocking member 440 may be formed by a silicidation on a surface of the first conductive layer 435.

The second conductive layer pattern 450 is formed on the blocking member 440 to completely fill up the recess structure 410. The recess structure 410 is filled with the lower portion of the second conductive layer pattern 450. The upper portion of the second conductive layer pattern 450 protrudes from the upper face of the active region by a predetermined height. The blocking member 440 encloses the lower portion of the second conductive layer pattern 450 buried in the recess structure 410. As described above, the second recess 420 has an enlarged cross section so that the lower portion of the second conductive layer pattern 450 also has an enlarged cross section of a circular shape, an elliptical shape or a track shape. A void 468 or a seam occurs in the lower portion of the second conductive layer pattern 450, and the void 468 or the seam may move toward a channel region of the semiconductor device formed along a lower portion of the gate electrode 445 in successive manufacturing processes. Here, the blocking member 440 blocks the void 468 from the channel region. Therefore, the gate electrode 445 may have a uniform threshold voltage, and a leakage current through the void 468 or the seam may be sufficiently prevented. When all transistors in a unit cell of a semiconductor device may have uniform threshold voltages, the semiconductor device may have enhanced electrical characteristics.

The gate mask 455 is formed on the second conductive layer pattern 450 of the gate electrode 445. The gate mask 455 may include, for example, nitride, oxynitride or oxide. The gate mask 455 serves as an etching mask for forming the gate electrode 445 and also electrically insulates the gate electrode 445 from upper wiring (not shown).

FIGS. 12A to 12D are cross-sectional views illustrating a method of manufacturing a semiconductor device having a recessed gate structure in accordance with some embodiments of the present invention.

Figure 12A:
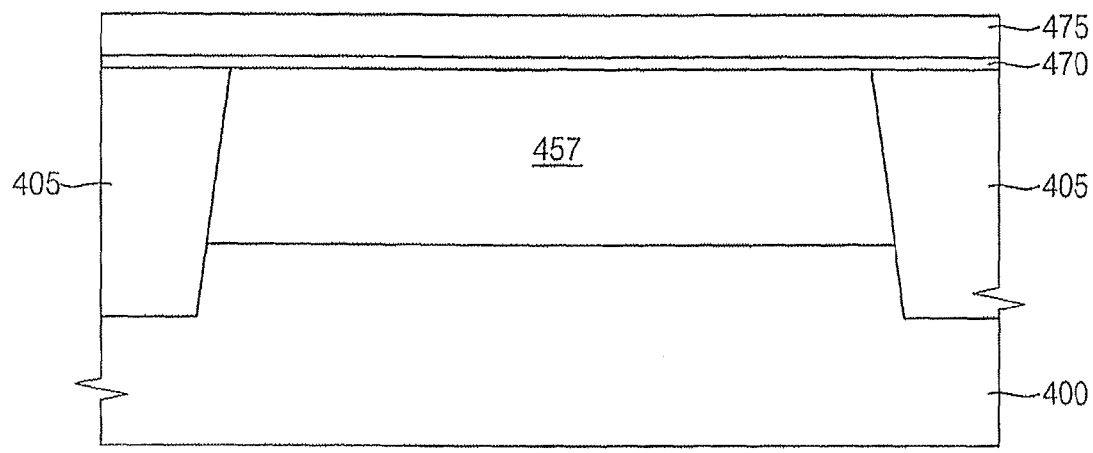
FIGS. 12A to 12D are cross-sectional views illustrating a method of manufacturing a semiconductor device having a recessed gate structure in accordance with some embodiments of the present invention.

Referring to FIG. 12A, an isolation layer 405 is formed on a substrate 400 by an isolation process so that the substrate 400 is divided into an active region and a field region. The isolation layer 405 may be formed, for example, using oxide by an STI process or an LOCOS process.

Impurities are doped into the active region of the substrate 400 by an ion implantation process such that preliminary source/drain regions 457 are formed in the active region. The preliminary source/drain regions 457 will be changed into source/drain regions 495 (see FIG. 12B).

A buffer oxide layer 470 is formed on the active region and the field region of the substrate 400. The buffer oxide layer 470 may be formed, for example, by a thermal oxidation process or a CVD process.

A first mask layer 475 is formed on the buffer oxide layer 470 using nitride or oxynitride. The first mask layer 475 may be formed, for example, by a CVD process, an ALD process, a PECVD process, an HDP-CVD process, an electron beam evaporation process, a PLD process, a sputtering process, etc.

Figure 12B:
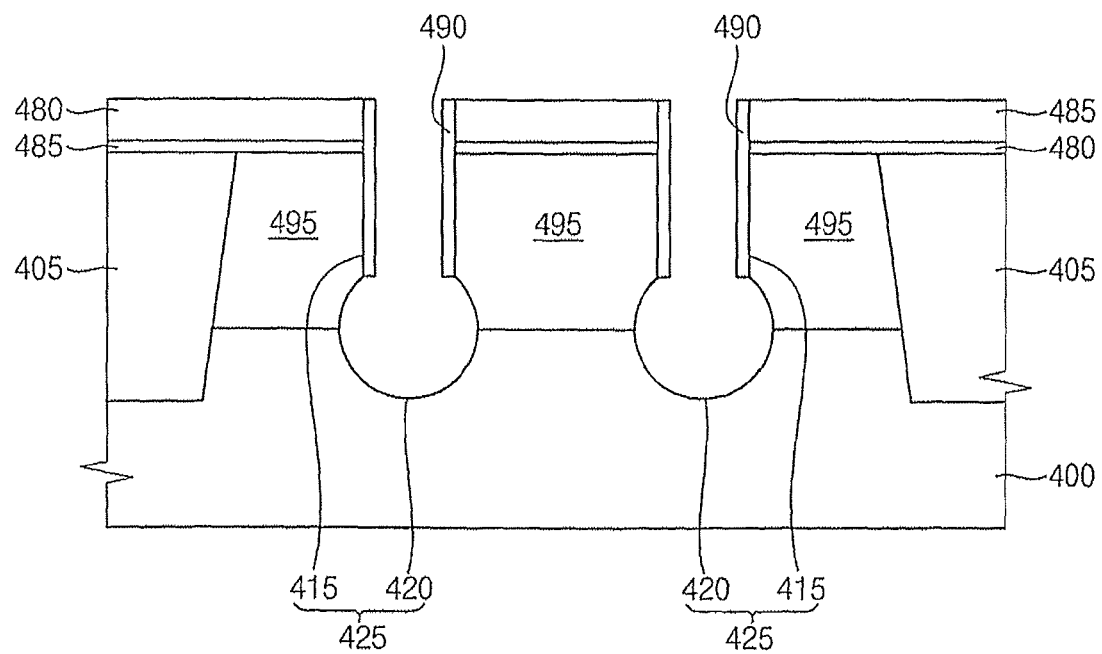

Referring to FIG. 12B, the first mask layer 475 is etched by a photolithography process so that a first mask 485 for a first recess 415 is formed on the buffer oxide layer 470. The first mask 485 serves as an etching mask for forming the first recess 415 at an upper portion the active region of the substrate 400.

The buffer oxide layer 470 and the substrate 400 are partially etched by an anisotropic etching process using the first mask 485 as the etching mask. Hence, the first recess 415 is formed at the upper portion of the substrate 400 and a buffer oxide layer pattern 480 is simultaneously formed on the substrate 400. The first recess 415 having a predetermined depth is formed at the upper portion of the substrate 300. The first recess 415 is vertically formed from a surface of the substrate 400 to have a predetermined depth. When the first recess 415 is formed, a portion of the substrate 400 corresponding to a bottom of the first recess 415 is exposed.

A second mask layer (not shown) is formed on the exposed portion of the substrate 400, the first mask 485 and sidewall of the first recess 415. The second mask layer may be formed using, for example, nitride, oxynitride or oxide by, for example, a CVD process, a PECVD process, an ALD process, an HDP-CVD process, a PLD process, an electron beam evaporation process, a sputtering process, etc.

Portions of the second mask layer on the first mask 485 and the exposed portion of the substrate 400 are etched by an isotropic etching process. Thus, a second mask 490 is formed on the sidewall of the first recess 415 only.

With an isotropic etching process using the second mask 490 as an etching mask, the exposed portion of the substrate 400 is removed to form a second recess 420 beneath the first recess 415. A portion of the substrate 400 corresponding to the sidewall of the first recess 415 is not etched in the formation of the second recess 420 because the second mask 490 is positioned on the sidewall of the first recess 415. The exposed portion of the substrate 400 is vertically and horizontally etched to thereby form the second recess 420 having an enlarged cross section beneath the first recess 415. When the first and the second recesses 415 and 420 are formed, a recess structure 425 having a lower portion enlarged in a rounded shape is formed at the upper portion of the substrate 400. Additionally, the preliminary source/drain regions 457 are changed into the source/drain regions 495 in accordance with the formation of the recess structure 425 in the active region.

Figure 12C:
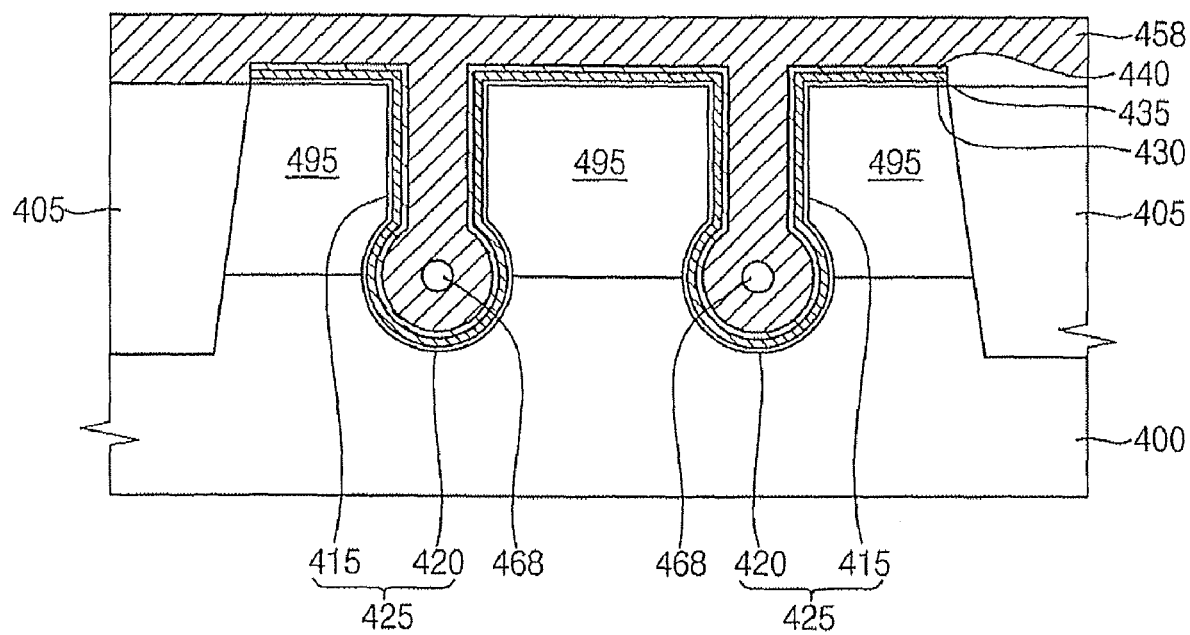

Referring to FIG. 12C, the second mask 490 is removed from the sidewall of the first recess 415, and then the first mask 485 and the buffer oxide layer pattern 480 are removed from the substrate 400.

A gate insulation layer 430 is formed on the recess structure 425 and the active region using, for example, oxide or metal oxide. Namely, the gate insulation layer 430 is formed along an upper face of the active region and a surface of the substrate 400 corresponding to the first and the second recesses 415 and 420. The gate insulation layer 430 may be formed, for example, by a thermal oxidation process, a CVD process, an ALD process, a PECVD process, an HDP-CVD process, etc.

A first conductive layer 435 is formed on the gate insulation layer 430 to partially fill up the recess structure 425. The first conductive layer 435 may be formed, for example, using doped polysilicon or metal, for example, by a CVD process, a PECVD process, an ALD process, a sputtering process, an electron beam evaporation process, a PLD process, etc. The first conductive layer 435 is formed along the surfaces of the recess structure 425 and on the upper face of the active region.

A blocking member 440 is formed on the first conductive layer 435. The blocking member 440 may be formed by a silicidation of an upper portion of the first conductive layer 435. Alternatively, the blocking member 440 may be formed by depositing metal silicide on the first conductive layer 435 through, for example, a CVD process, a PECVD process, an ALD process, an HDP-CVD process, etc.

A second conductive layer 458 is formed on the substrate 400 and the blocking member 440 to completely fill up the recess structure 425. The second conductive layer 458 may be formed, for example, using doped polysilicon or metal, for example, by a CVD process, a PECVD process, an ALD process, a sputtering process, an electron beam evaporation process, a PLD process, etc. Since the second conductive layer 458 fills up the recess structure 425 having the enlarged second recess 420, a void 468 or a seam is formed in the second conductive layer 458. Particularly, the void 468 or the seam is generated in a lower portion of the second conductive layer 458 buried in the second recess 420.

Figure 12D:
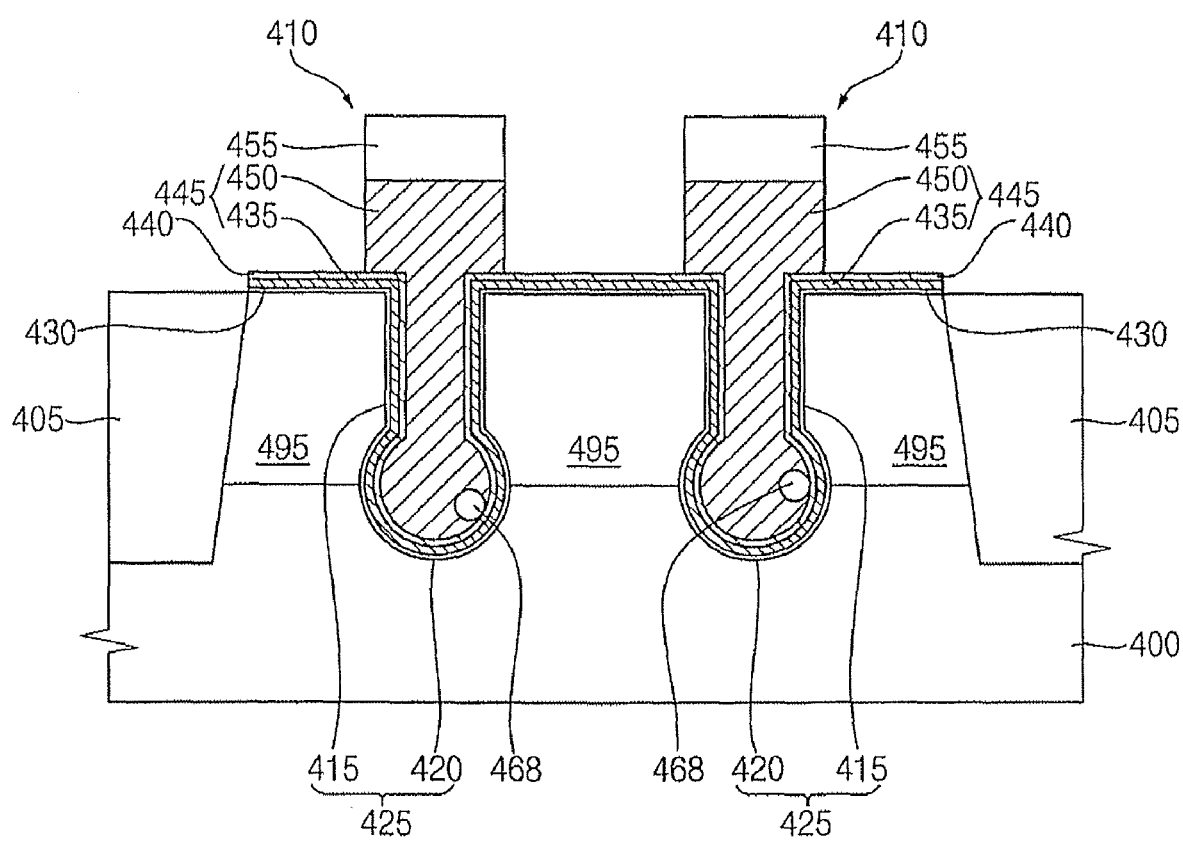

Referring to FIG. 12D, a gate mask layer (not shown) is formed on the second conductive layer 458, and then the gate mask layer is partially etched by a photolithography process. Thus, a gate mask 455 is formed on the second conductive layer 458. The gate mask layer may be formed, for example, using nitride, oxynitride or oxide by, for example, a CVD process, a PECVD process, an ALD process, an HDP-CVD process, a sputtering process, an electron beam process, a PLD process, etc.

During the process for forming the gate mask 455 and/or a subsequent process for forming upper wiring, the void 468 or the seam in the lower portion of the second conductive layer 458 moves toward the gate insulation layer 430 adjacent to the source/drain regions 495. Here, the blocking member 440 enclosing the lower portion of the second conductive layer 458 effectively prevents the void 468 or the seam from contacting the gate insulation layer 430.

Still referring to FIG. 12D, the second conductive layer 458 is partially etched using the gate mask 455 as an etching mask to form a second conductive layer pattern 450 having the lower portion buried in the recess structure 425 and an upper portion protruded from the active region. Thus, a recessed gate structure 410 having the gate insulation layer 430, the blocking member 440, a gate electrode 445 and the gate mask 455 is completed on the active region of the substrate 400. Here, the gate electrode 445 includes the first conductive layer 435 and the second conductive layer pattern 450. The source/drain regions 495 of the semiconductor device are positioned at portions of the substrate 400 adjacent to the recessed gate structure 410.

According to the present invention, a blocking member is formed in a recessed gate structure having an enlarged lower portion so that the blocking member effectively prevents a void or a seam in the lower portion of the recessed gate structure from contacting a gate insulation layer making contact with the channel region. Therefore, a semiconductor device including the recessed gate structure may have a uniform threshold voltage and a leakage current through the voids or the seam may considerably decrease. Additionally, since the recessed gate structure has the lower portion enlarged in a circular shape, an elliptical shape or a track shape, the channel region formed along the lower portion of the recessed gate structure may have a greatly increased length to ensure improved electrical characteristics of the semiconductor device.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of this invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a recessed gate structure, comprising:
    forming a recess structure having an enlarged lower portion in a substrate;
    forming a gate insulation layer on surfaces of the recess structure and the substrate;
    forming a gate electrode partially buried in the recess structure on the gate insulation layer, comprising forming a first conductive layer pattern on the gate insulation layer to partially fill up the recess structure;

forming a blocking member on the first conductive layer pattern;

forming a second conductive layer pattern on the blocking member to fill up the recess structure; and forming a third conductive layer pattern on the first conductive layer pattern, the second conductive layer pattern and the blocking member.

2. The method of claim 1, wherein forming the recess structure comprises:

forming a first mask on the substrate;

forming a first recess from the surface of the substrate by etching the substrate using the first mask;

forming a second mask on a sidewall of the first recess; and forming a second recess beneath the first recess by etching the substrate using the second mask.

3. The method of claim 1, wherein the blocking member is formed by an oxidization or a silicidation of a surface of the first conductive layer.

4. The method of claim 1, wherein forming the first conductive layer pattern and forming the blocking member comprise:

forming a first conductive layer on the gate insulation layer;

forming a preliminary blocking member on the first conductive layer; and forming the first conductive layer pattern and the blocking member by partially removing the first conductive layer and the preliminary blocking member.

5. The method of claim 4, wherein the preliminary blocking member is partially removed using an etching solution including fluorine or an etching gas including fluorine, and the first conductive layer is partially removed by an etch-back process.

6. The method of claim 1, wherein the second conductive layer pattern is formed on the blocking member so as to protrude from the substrate.

7. A method of manufacturing a semiconductor device, comprising:

forming an isolation layer on a substrate to define an active region;

forming a recess structure having an enlarged lower portion in the active region;

forming a gate insulation layer from a surface of the recess structure onto the active region;

forming a gate electrode partially buried in the recess structure on the gate insulation layer, comprising forming a first conductive layer pattern on the gate insulation layer to partially fill up the recess structure;

forming a blocking member on the first conductive layer pattern;

forming a second conductive layer pattern on the blocking member to fill up the recess structure;

forming a third conductive layer pattern on the first conductive layer pattern, the second conductive layer pattern and the blocking member; and forming source/drain regions at portions of the substrate adjacent to the gate electrode.

8. The method of claim 7, wherein the blocking member is formed by an oxidization and a silicidation of a surface of the first conductive layer.

9. The method of claim 7, wherein forming the first conductive layer pattern and forming the blocking member comprise:

forming a first conductive layer on the gate insulation layer;

forming a preliminary blocking member on the first conductive layer; and forming the first conductive layer pattern and the blocking member by partially removing the first conductive layer and the preliminary blocking member.

10. The method of claim 7, wherein the second conductive layer pattern is formed on the blocking member so as to protrude from the substrate.

* * * * *